United States Patent
Kagaya

(10) Patent No.: US 10,307,849 B2
(45) Date of Patent: Jun. 4, 2019

(54) VACUUM-PROCESSING DEVICE AND CONTROL METHOD THEREFOR, AND VACUUM SOLDERING DEVICE AND CONTROL METHOD THEREFOR

(71) Applicant: Senju Metal Industry Co., Ltd., Tokyo (JP)

(72) Inventor: Tomotake Kagaya, Chiba (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/507,906

(22) PCT Filed: Aug. 28, 2015

(86) PCT No.: PCT/JP2015/074416
§ 371 (c)(1),
(2) Date: Mar. 1, 2017

(87) PCT Pub. No.: WO2016/035703
PCT Pub. Date: Mar. 10, 2016

(65) Prior Publication Data
US 2017/0282270 A1    Oct. 5, 2017

(30) Foreign Application Priority Data
Sep. 2, 2014 (JP) ................... 2014-178291

(51) Int. Cl.
*B23K 1/00* (2006.01)
*B23K 1/008* (2006.01)
(Continued)

(52) U.S. Cl.
CPC .............. *B23K 1/008* (2013.01); *F04B 37/14* (2013.01); *F04B 49/065* (2013.01);
(Continued)

(58) Field of Classification Search
CPC ...... F04D 19/04; F04D 19/042; F04D 27/004; B23K 1/008; B23K 3/08
See application file for complete search history.

(56) References Cited

U.S. PATENT DOCUMENTS

2007/0048145 A1   3/2007  Ishii et al.
2012/0051942 A1   3/2012  Schmid et al.
(Continued)

FOREIGN PATENT DOCUMENTS

CN      102848695 A     1/2013
CN      103394783 A     11/2013
(Continued)

*Primary Examiner* — Erin B Saad
(74) *Attorney, Agent, or Firm* — The Webb Law Firm

(57) ABSTRACT

The invention enables quick evacuation of a chamber to a specified target degree of vacuum while increasing selectivity of evacuation conditions. A vacuum-processing device contains a chamber 40 that enables a workpiece to be soldered in a vacuum environment, an operating part 20 that sets a condition for evacuating the chamber 40, a pump 23 that evacuates the chamber 40, and a control portion 61 that calculates the amount of decrease in the degree of vacuum when evacuating the chamber 40 using a predetermined pump output, sets the calculated value as a reference value and switches an evacuation property from the evacuation property including a lower pump output to the evacuation property including a higher pump output when the calculated amount of decrease in degree of vacuum in real time has become smaller than the reference value.

4 Claims, 17 Drawing Sheets

(51) Int. Cl.
    *H05K 3/34*     (2006.01)
    *F04B 37/14*     (2006.01)
    *F04C 25/02*     (2006.01)
    *F04B 49/06*     (2006.01)
    *F04C 18/02*     (2006.01)
    *H01L 23/00*     (2006.01)
    *F04C 28/08*     (2006.01)
    *F04D 19/04*     (2006.01)
    *F04D 27/02*     (2006.01)
    *B23K 101/42*     (2006.01)
    *F04D 17/16*     (2006.01)
    *F04C 18/12*     (2006.01)

(52) U.S. Cl.
    CPC .......... *F04C 18/0207* (2013.01); *F04C 25/02* (2013.01); *F04C 28/08* (2013.01); *F04D 19/04* (2013.01); *F04D 27/0261* (2013.01); *H01L 24/75* (2013.01); *H05K 3/34* (2013.01); *B23K 2101/42* (2018.08); *F04B 2205/09* (2013.01); *F04C 18/12* (2013.01); *F04C 2240/403* (2013.01); *F04D 17/168* (2013.01); *H01L 2224/759* (2013.01); *H01L 2224/75102* (2013.01); *H01L 2224/75283* (2013.01); *H05K 2203/085* (2013.01); *H05K 2203/163* (2013.01)

(56) References Cited

U.S. PATENT DOCUMENTS

| | | |
|---|---|---|
| 2012/0153010 A1 | 6/2012 | Abe |
| 2016/0339531 A1 | 11/2016 | Hiyama et al. |

FOREIGN PATENT DOCUMENTS

| | | |
|---|---|---|
| JP | 2215978 A | 8/1990 |
| JP | 4220166 A | 8/1992 |
| JP | 9314322 A | 12/1997 |
| JP | 200771200 A | 3/2007 |
| JP | 2008068311 A | 3/2008 |
| JP | 2011245527 A | 12/2011 |
| JP | 5601436 B1 | 10/2014 |
| TW | 201110295 A1 | 3/2011 |

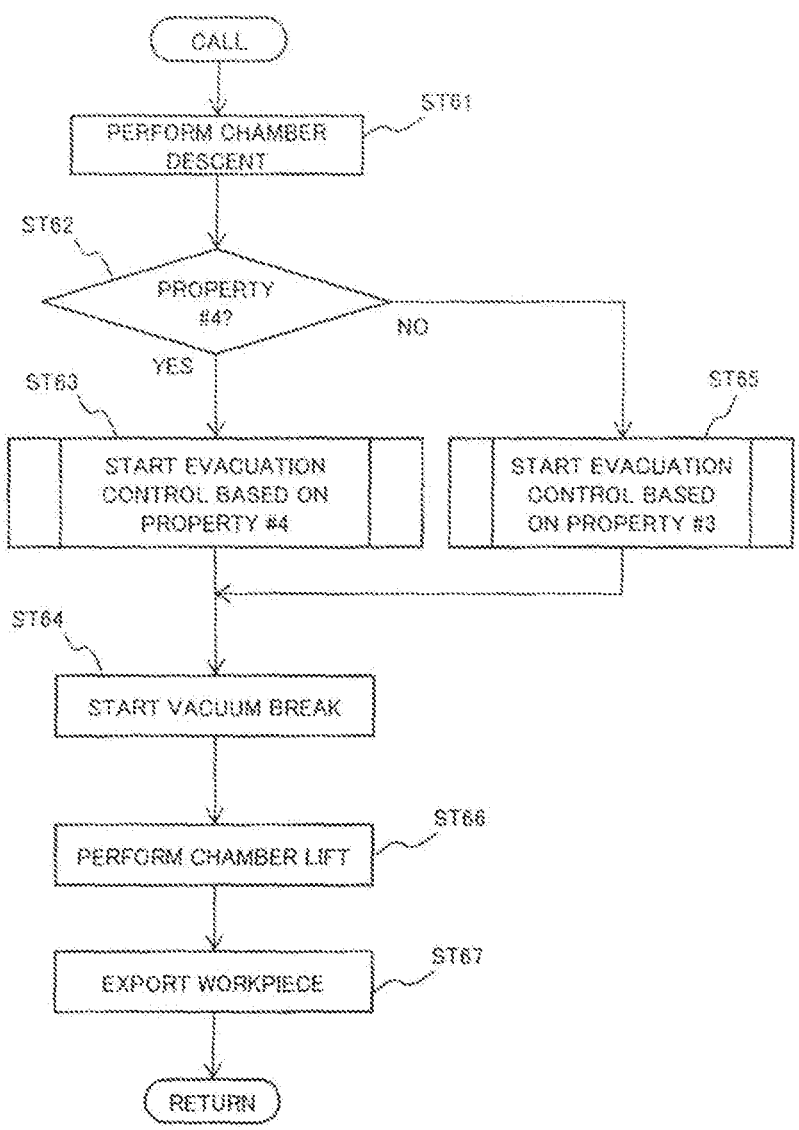

VACUUM-PROCESSING DEVICE AND CONTROL METHOD THEREFOR, AND VACUUM SOLDERING DEVICE AND CONTROL METHOD THEREFOR

CROSS-REFERENCE TO RELATED APPLICATIONS

This application is the United States national phase of International Application No. PCT/JP2015/074416 filed Aug. 28, 2015, and claims priority to Japanese Patent Application No. 2014-178291 filed Sep. 2, 2014, the disclosures of which are hereby incorporated in their entirety by reference.

TECHNICAL FIELD

The present invention relates to a vacuum-processing device which is used to subject a workpiece arranged in a chamber to predetermined processing in a vacuum environment, and a control method therefor. Also, the invention relates to a vacuum soldering device which is applicable to a vacuum reflow furnace having a function of defoaming and/or deaerating voids from solder in a vacuum molten state when mounting a surface mounting component or the like at a predetermined position on a substrate to solder the component and the substrate, and a control method therefor.

BACKGROUND

The following will describe the vacuum-processing device and the control method therefor according to the present invention in a case where they are applied to a vacuum soldering device (referred to also as "vacuum reflow device"). Conventionally, voids generated in hot blast reflow processing under a normal atmospheric pressure have been regarded as a problem in reflow mounting steps for large-current elements such as mounting of power devices, power modules and the like, and a technique of decreasing the generation of voids has been demanded.

FIGS. 14A and 14B are schematic views each showing a hot blast reflow example according to a conventional example. Cream solder 8 shown in FIG. 14A is applied onto a pad electrode 4 in a substrate 5. The cream solder 8 has appropriate viscosity due to addition of flux to solder powder, and is applied onto the pad electrode 4 in the substrate 5 through a mask by means of a screen printer.

In this conventional hot blast reflow, the cream solder 8 is subjected to hot blast reflow processing, and, when the solder has been brought in a molten state, voids 2 are generated in the molten solder. Also when the molten solder (molten solder 7) is cooled and solidified, these voids 2 disadvantageously remain as they are in the solder.

Regarding the generation of voids, a state where the cream solder 8 is applied onto the pad electrode 4 in the substrate 5 and subjected to the hot blast reflow processing under an atmospheric pressure with no electronic component being mounted will now be schematically explained with reference to FIGS. 14A and 14B. The solder 3 shown in FIG. 14B indicates a state such that, after the hot blast reflow processing of the cream solder 8 shown in FIG. 14A, the molten solder 7 has been cooled and solidified in a spherical shape by surface tension. The outlined white circle shapes in this figure represent the portions of the voids 2, which have unintentionally been produced in the molten solder 7 and still remain in the solder 3 even after cooling and solidification thereof. The voids 2 impair heat conduction effect and cause deterioration of heat exhaust in power devices and the like.

Concerning the reduction in generation of voids as described above, Patent Document 1 discloses a soldering device (vacuum reflow device) having the vacuum evacuation function. This soldering device includes an exhaust valve, a vacuum pump and a processing tank, and is configured so that a substrate is imported into the processing tank and, in a molten state of solder on a pad electrode in the substrate, the exhaust valve is opened to drive the evacuation pump, thereby once evacuating the processing tank. Such a vacuum state allows the voids remained in the solder during solder melting to be removed by virtue of the defoaming and/or deaerating effect.

DOCUMENTS FOR PRIOR ART

Patent Documents

Patent Document 1: Japanese Patent Application Publication No. Hei 09-314322 A

SUMMARY OF THE INVENTION

Problems to be Solved by the Invention

However, the vacuum reflow device of the conventional example involves the following problems.

At the time of soldering as seen in Patent Document 1, the chamber (processing tank) is brought into a vacuum state. At this moment, the vacuum evacuation pump is operated to create the vacuum state. In the conventional system, a method is adopted in which the vacuum evacuation pump continuously operates on using a fixed pump output based on the set vacuum-processing time, the set target degree of vacuum (referred to also as "pressure") and the like as parameters.

One example thereof will be explained using a vacuum evacuation pump referred to as oil-free type scroll pump. In the vacuum evacuation pump, the number of revolutions of an alternating current motor can be changed by switching the vacuum pump operating frequency, and the pump output can be changed by changing the number of revolutions of the motor.

FIG. 15 shows an evacuation property when evacuation was performed using a fixed pump output. A property represented by plotting the evacuation time (horizontal axis: t (sec.)) relative to the degree of vacuum (vertical axis: pressure P (Pa)), which is obtained by evacuating the chamber using a predetermined pump output, is referred to as "evacuation property". FIG. 15 indicates, as examples, the case where the motor was driven at a predetermined vacuum pump operating frequency mHz and the case where the motor was driven at a predetermined nHz higher than the vacuum pump operating frequency mHz. Incidentally, the evacuation time is defined as the period of time from the closing of the chamber to start evacuation to the completion of the evacuation. After the completion of the evacuation, vacuum break is started. In FIG. 15, it refers to a period of time between k and 20 sec. on the time (t) axis. After arrival at a set degree of vacuum, the period of time during which the degree of vacuum is maintained is changed according to the set evacuation time.

From the evacuation properties shown in FIG. 15, it is understood that, in the case where the motor was driven at the vacuum pump operating frequency nHz, the time necessary for arrival at a predetermined degree of vacuum (Pf) is shorter than that in the case where the motor was driven at the vacuum pump operating frequency mHz.

Therefore, it is understood that, in order to shorten the evacuation time for shortening the period of time from the viewpoint of production cycle, the use of a high pump output is effective. While evacuation results in defoaming and/or deaerating of the voids, rapid defoaming and/or deaerating takes place due to a high pump output. Upon the rapid defoaming and/or deaerating, the voids 2 break (burst) in the molten solder 7, in the process of defoaming and/or deaerating the voids 2 therefrom, thereby causing scattering of flux, components and solder.

On the other hand, when a low pump output is employed, the break (burst) of the voids 2 is suppressed in the defoaming and/or deaerating process, so that scattering of flux, components and solder can be suppressed. When a low pump output is employed, however, there arises a problem that much time is required as the evacuation time from the beginning of evacuation of the chamber, through the arrival at the set target degree of vacuum (Pf), to the beginning of vacuum break.

According to the evacuation properties shown in FIG. 15, it is understood that the amount of decrease in pressure per unit time is displaced along a virtual asymptotic line (Lm, Ln) at an initial stage, but tends to be greatly separated away from the virtual asymptotic line as the degree of vacuum approaches the target degree of vacuum. Also, it is understood that, as the pump output is higher, the virtual asymptotic line is inclined greatly.

Accordingly, the present inventors have found that the evacuation time can be shortened by performing evacuation control along the initial virtual asymptotic line at the beginning of evacuation from the atmospheric pressure state, and that, for that purpose, the pump output is sequentially switched to a higher pump output based on a predetermined reference, so that the scattering of flux, components and solder is suppressed to a level similar to that when continuous evacuation is performed at a fixed vacuum pump operating frequency, whereby the evacuation time can be shortened, and then the present invention is completed.

Also, they have found that, if the same evacuation time is adopted, the scattering of flux, components and solder would be reduced, as compared with conventional cases, by employing a combination of pump outputs including those lower than the single pump output used in the conventional cases and those higher than the single pump output therein, and performing control to sequentially switch the pump output to a higher output, in order that the inclination of the virtual asymptotic line is milder than that of the virtual asymptotic line in the case of the single pump output in the conventional devices, and then have completed the present invention.

Means for Solving the Problems

In order to solve the above-described problems, the invention in clause 1 relates to a vacuum-processing device including: a chamber to be evacuated; an operating part that sets a condition for evacuating the chamber; a pump that evacuates the chamber based on the evacuation condition, the pump having a plurality of pump outputs; and a control portion that performs an evacuation control of the pump so as to switch a pump output to a higher pump output based on a fact that an amount of decrease in degree of vacuum per unit time, at a time of evacuation of the chamber using a predetermined pump output, has become smaller than a reference value, wherein the control portion sets, as the reference value, the amount of decrease in degree of vacuum per unit time when a predetermined time elapses from the evacuation of the chamber using a predetermined pump output.

According to the vacuum-processing device in clause 1, the pump output is sequentially switched to a higher output when the amount of decrease in degree of vacuum per unit time has become smaller than the reference value. Thus, it is made possible to increase the selectivity of the evacuation conditions, and it becomes easy to set the time necessary for the degree of vacuum within the chamber using a predetermined pump output, has become smaller than a reference value.

The invention in clause 3 relates to the vacuum-processing device according to clause 1, wherein the control portion always compares the amount of decrease in degree of vacuum per unit time for the selected pump output with the reference value during evacuation, and switches the pump output to the higher pump output when the amount of decrease in degree of vacuum per unit time has become smaller than the reference value.

The invention clause 4 relates to a vacuum soldering device including the vacuum-processing device according to clause 1 or 3. The vacuum soldering device in clause 4 can suppress the generation of voids and can also suppress scattering of flux, components and the like.

The invention in clause 5 relates to a method for controlling a vacuum-processing device, including: a step of setting an amount of decrease in degree of vacuum per unit time when a predetermined time elapses from the evacuation of a chamber using a predetermined pump output as a reference value; and a step of switching a pump output to a higher pump output based on a fact that the amount of decrease in degree of vacuum per unit time when evacuating the chamber using a predetermined pump output has become smaller than the reference value.

The invention in clause 7 relates to the method for controlling the vacuum-processing device according to clause 5, including a step of switching the predetermined pump output to another higher pump output once the reference value has been set after the step of setting the reference value.

The invention in clause 8 relates to a method for controlling the vacuum soldering device, wherein the controlling method according to clause 5 or 7 is performed.

Effects of the Invention

According to the present invention, when the amount of decrease in degree of vacuum per unit time has become smaller than the reference value, the pump output is switched from an evacuation control property involving a low pump output to an evacuation control property involving a high pump output.

This control allows selectivity of evacuation conditions to be increased and enables quick evacuation of a chamber to a specified target degree of vacuum. Thus, the throughput of the chamber can be adjusted. When the present invention is applied to a soldering device, it is possible to prevent splashing of flux, solder scattering and the like and to perform high-quality vacuum soldering with fewer voids under a set degree of vacuum.

BRIEF DESCRIPTION OF THE DRAWINGS

FIG. 11 is a flowchart showing a control example (subroutine) of the vacuum reflow furnace 100.

EMBODIMENTS FOR CARRYING OUT THE INVENTION

The present invention has an object to provide a vacuum-processing device configured so that the time necessary for the degree of vacuum within a chamber to arrive at a specified target degree of vacuum can be shortened by decreasing a change in amount of decrease in degree of vacuum per unit time, and a control method therefor, and also to provide a vacuum soldering device configured so that it is made possible to shorten cycle time and to suppress the generation of voids and scattering of flux, components and the like by applying the vacuum-processing device and the control method therefor to the vacuum soldering device, and a control method therefor.

Figure 1:
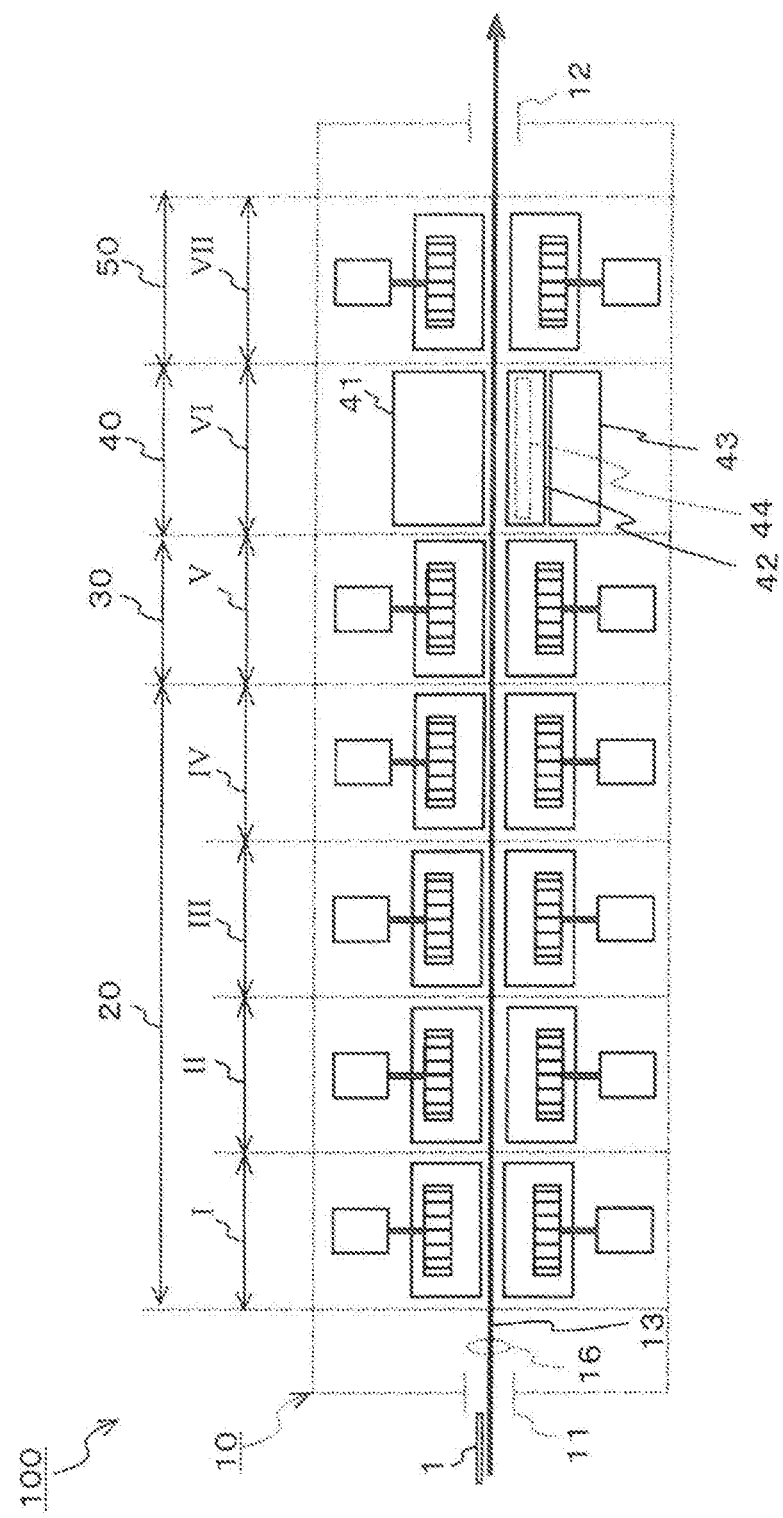
FIG. 1 is a cross sectional view of a vacuum reflow furnace 100 as an embodiment according to the present invention for showing a configuration example thereof.

The following will describe a vacuum soldering device and a control method therefor as embodiments according to the present invention with reference to the drawings, for a case where the vacuum-processing device and the control method therefor according to the present invention are applied to a vacuum soldering device (referred to also as "vacuum reflow device"). A vacuum reflow furnace 100 shown in FIG. 1 constitutes one example of the vacuum soldering device, and is configured to perform defoaming and/or deaerating in vacuum, for example, when a surface mounting component such as mounting of a power device or power module is mounted at a predetermined position on a printed circuit board to solder the component and the printed circuit board. The target objects to be soldered are a printed circuit board, a solder-coated component, a semiconductor wafer and the like, and are collectively referred to as "workpiece 1".

The vacuum reflow furnace 100 has a main body 10. The main body 10 constitutes a muffle furnace. For example, the main body 10 has a conveying path 16 at an intermediate layer thereof, and is divided into a muffle upper part and a muffle lower part, not shown, based on this conveying path 16. The main body 10 has a hinge mechanism on a back side thereof. The muffle upper part is lid-opened so that the conveying path 16 can be seen and inspected.

An inlet 11 is provided on one side of the main body 10, and an outlet 12 is provided on the other side thereof. A conveying portion 13 is provided on the conveying path 16 between the inlet 11 and the outlet 12. For the conveying portion 13, a conveyance mechanism 70 of a walking beam type is used (see FIG. 5) in this embodiment. According to this conveyance mechanism 70, the workpiece 1 can be intermittently fed at a predetermined conveying velocity. Within the main body 10, a preliminary heating portion 20, a main heating portion 30, a chamber 40 and a cooling portion 50 are arranged in order from the inlet 11, and the workpiece 1 is intermittently fed so as to pass through these portions to reach the outlet 12.

The preliminary heating portion 20 and the main heating portion 30 constitute one example of a heating portion which employs a hot blast circulation heating system. The preliminary heating portion 20 has four preliminary heating zones I to IV in which the workpiece 1 is gradually heated (for example, around 150-160-170-180° C.) to reach a predetermined temperature (for example, 180° C.). The preliminary heating zones I to IV are arranged above and below the conveying path 16. The main heating portion 30 having a main heating zone V is arranged at a position adjacent to the preliminary heating portion 20. The workpiece 1 is heated up to around 250° C. in the main heating zone V before the workpiece 1 is charged into the chamber 40.

Figure 2:
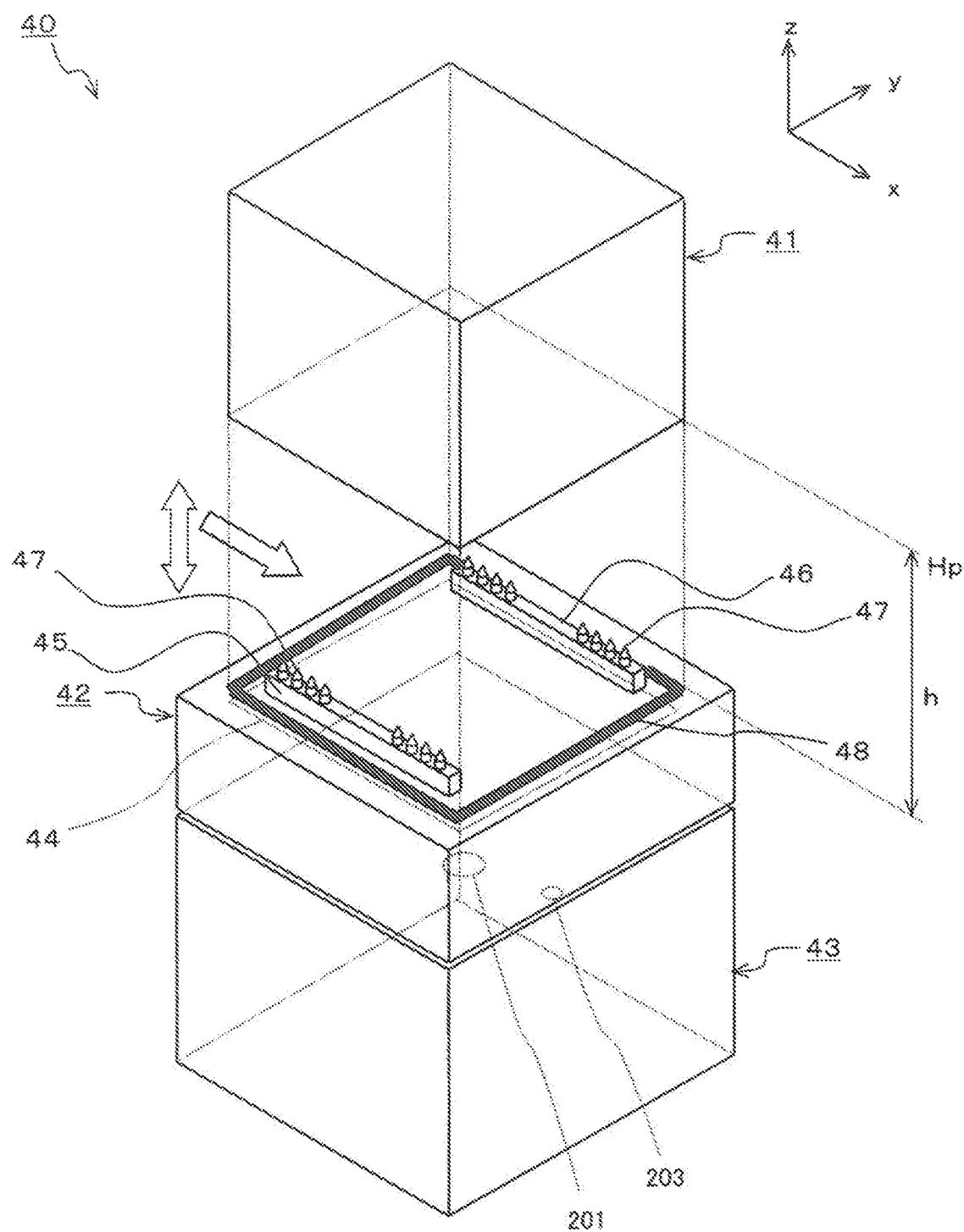
FIG. 2 is a perspective view of a chamber 40 for showing a configuration example thereof.

The chamber 40 with a vacuum defoaming and/or deaerating zone VI is disposed at a position that is adjacent to the main heating portion 30. The chamber 40 performs the defoaming and/or deaerating under a vacuum environment at the time of soldering on the workpiece 1. The chamber 40 shown in FIG. 2 has a container 41, a base 42 and an elevating mechanism 43. FIG. 2 shows a state where the container 41 is away from the base 42 and stops at a predetermined upper position. Hereinafter, the stop position of the container 41 is referred to as a "home position Hp". The home position Hp is a position where the container 41 is positioned above the base 42 by a height "h" from a reference position. Any height "h" may be employed so long as the workpiece 1 is not hindered when it is carried from the main heating portion 30 onto the base 42.

The container 41 has a bottom surface-opened casing structure. For example, the container 41 is arranged so that a box-like body made of stainless steel is upside down and is arranged like a lid. The inside of the container 41 is a cavity (space). The container 41 is configured to move vertically by the elevating mechanism 43. Here, when a conveying direction of the workpiece 1 is set to be an "x" direction, a direction that is orthogonal to this conveying direction is set to be a "y" direction and a direction that is orthogonal to the "x" and "y" directions is set to be a "z" direction, the container 41 moves vertically along this "z" direction at the time of vacuum-processing.

The base 42 is arranged below the container 41, and the elevating mechanism 43 is arranged below this base 42. In the elevating mechanism 43, an electrically-operated cylinder, a pneumatically-operated cylinder or the like is used. The base 42 has a plane which is broader than the size of a bottom surface of the container 41 and a predetermined thickness. The base 42 has an airtight seal member 48 at a position with which an end part of the bottom surface of the container 41 is contacted. Since the seal member 48 is required to have heat resistance, fluorine-based packing, for example, is used.

An exhaust port 201 is provided at a predetermined position on a lower surface of the base 42. The exhaust port 201 is connected to an electromagnetic valve 22 shown in FIG. 4. Further, a gas-supplying port 203 is provided at a predetermined position on the lower surface of the base 42. The gas-supplying port 203 is connected to a release valve 25 shown in FIG. 4.

In addition, a panel heater 44 is provided at a predetermined position on the base 42 of the container 41. The panel heater 44 constitutes one example of the heating portion and is configured to heat the workpiece 1 to a predetermined temperature (around 240° C.) and keep it at the temperature. This heating is performed because the predetermined temperature by the main heating portion 30 before charging of the workpiece 1 into the chamber 40 is maintained even after the workpiece 1 has been charged into the chamber 40. The heating system of the panel heater 44 is a far infrared radiation panel system as one example. The panel heater 44 is not limited to be provided on the base 42, and may be provided at a predetermined position on a side of the container 41.

A pair of fixed beams 45, 46 is provided at a predetermined position of each side on an upper surface of the base 42. The fixed beams 45, 46 constitute one example of the conveying portion 13. For example, the fixed beam 45 is disposed at a left side end of the upper surface of the base 42, and the fixed beam 46 is disposed at a right side end thereof. They are configured to support both sides of the workpiece 1 in the chamber 40.

The fixed beams 45, 46 are composed of plate-like block members, and a plurality of pins 47 each having a cone-shaped head are arranged on the upper surface of each of the plate-like block members. In this example, the pins 47 are grouped four by four, and are arranged with a predetermined arrangement pitch. This arranging with the predetermined arrangement pitch is because the workpieces 1 can be supported, without hindrance, corresponding to a plurality of lengths of the workpieces 1. Thus, the vacuum reflow furnace 100 is configured.

The cooling portion 50 having a cooling zone VII is provided at a position adjacent to the chamber 40. This is a zone to cool the workpiece 1 which has been defoamed and/or deaerated (hereinafter, referred to as "vacuum deaeration") after vacuum break. The workpiece 1 cooled in this way is exported from the device via the outlet 12.

Here, an example of vacuum deaeration from the solder 3 will be explained with reference to FIGS. 3A and 3B. In this example, a pad electrode 4 is formed in a substrate 5 such as a printed circuit board and a semiconductor wafer, particularly, a substrate for power device as the workpiece 1, and the solder 3 is formed on this pad electrode 4. The size of the substrate 5 is of, for example, about 250 mm in width×about 300 mm in length. Further, the size of the pad electrode 4 in this example is of about 5 mm×about 5 mm.

Figure 3A:
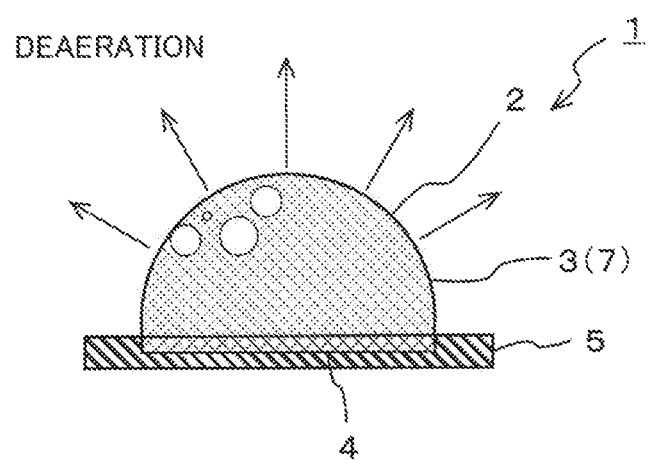
FIG. 3A is a schematic view showing an example (Part 1) of vacuum defoaming and/or deaerating of solder 3.

FIG. 3A shows a state of molten solder 7 in which the solder 3 has not solidified yet. The outlined white shapes (circles or ellipses) shown in the figure represent the portions of the voids 2, and the shapes of the voids 2 grow as the degree of vacuum in the chamber 40 becomes lower (or the degree of vacuum becomes higher). The voids 2 are drawn to outside in the evacuation so that there occurs a difference in degree of vacuum between the voids 2 and a boundary surface of the solder. The voids 2 in the molten solder 7 come out to outside (being defoamed and/or deaerated).

Figure 3B:
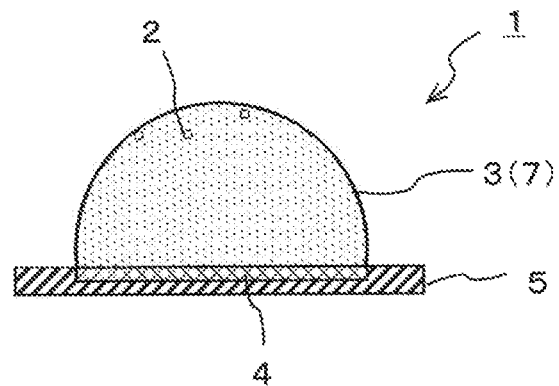
FIG. 3B is a schematic view showing an example (Part 2) of vacuum defoaming and/or deaerating of the solder 3.

The solder 3 shown in FIG. 3B is in a molten state when the degree of vacuum within the container 41 has reached a target pressure (hereinafter, referred to as a "set target pressure Pf"). In the present invention, when the chamber is evacuated using a predetermined pump output, the amount of decrease in degree of vacuum (referred to also as "pressure") per unit time for the currently selected pump output is monitored; control is performed so that the pump output is sequentially switched to a pump output higher than the currently selected pump output among a plurality of pump outputs, based on a fact that the amount of decrease in degree of vacuum per unit time has become smaller than a predetermined value; and, after arrival at the set target pressure Pf as will be explained later, control is performed so that this set target pressure Pf is maintained for a predetermined time.

Thus, the time necessary for arrival at the set target pressure Pf can be shortened, as compared with conventional devices which perform evacuation using a single pump output, by performing the control to sequentially switch a plurality of pump outputs, based on the fact that the amount of decrease in pressure per unit time has become smaller than the predetermined value, until the degree of vacuum has reached the set target pressure Pf.

Figure 4:
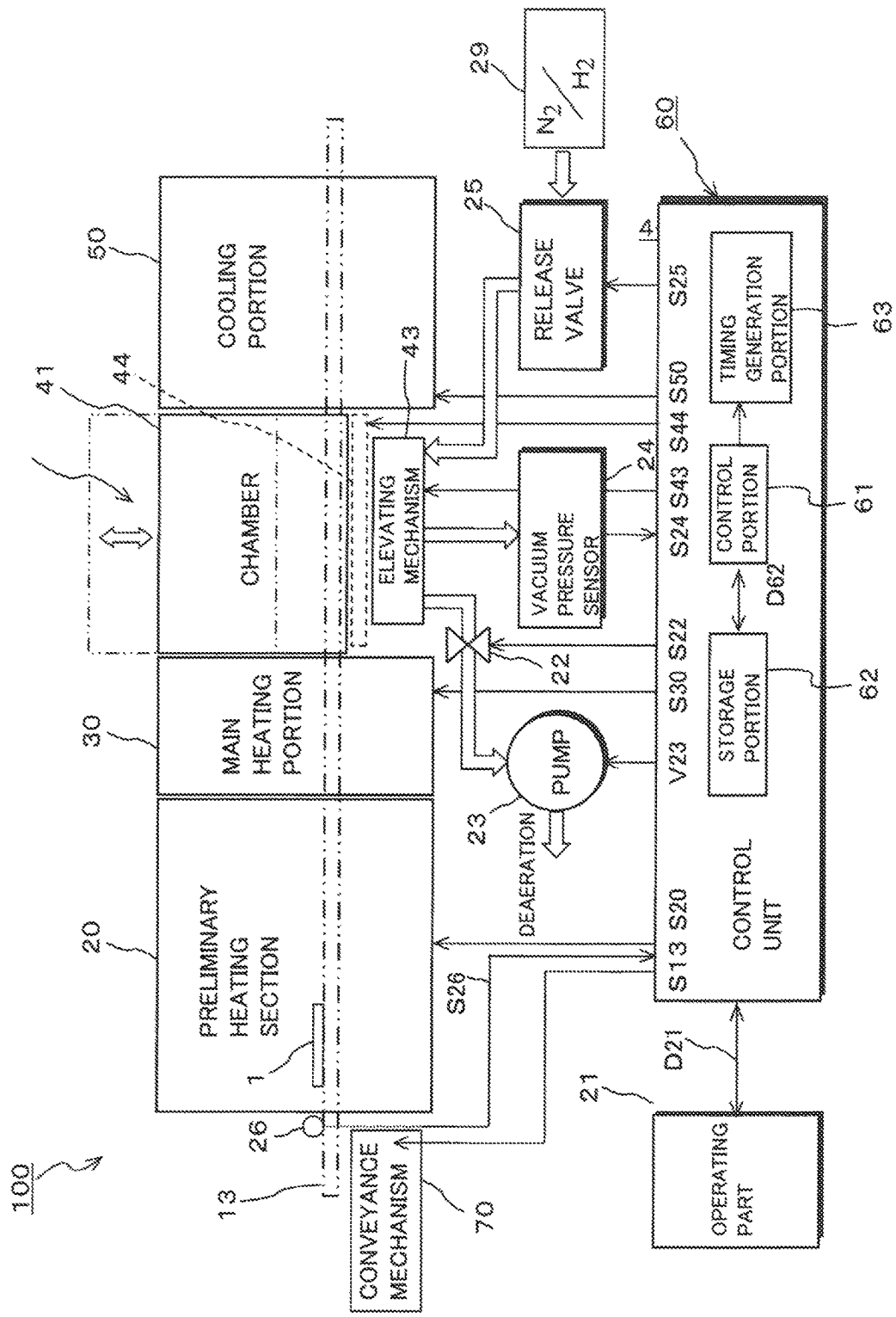
FIG. 4 is a block diagram of a control system of the vacuum reflow furnace 100 for showing a configuration example thereof.

The following will describe a configuration example of a control system of the vacuum reflow furnace 100 with reference to FIG. 4. According to the control system of the vacuum reflow furnace 100 shown in FIG. 4, an operating part 21, the electromagnetic valve 22, a pump 23, a vacuum pressure sensor 24, the release valve 25, an arrival sensor 26, the elevating mechanism 43, the panel heater 44, and a control unit 60 are provided for controlling the preliminary heating portion 20, the main heating portion 30, the chamber 40, the cooling portion 50 and the conveyance mechanism 70. The control unit 60 has a control portion 61, a storage portion 62, a timing generation portion 63 and the like.

The operating part 21 is connected to the control unit 60, and is configured to set the evacuation time and initially set the set target pressure Pf in the chamber 40 during vacuum deaeration (for example, Pf=10000 [Pa]), the pump output, the effective range allowed for the set target pressure Pf (for example, Pf=10000 [Pa]±1000 [Pa]) or the like.

For the operating part 21, a liquid crystal display panel, a numeric keypad and the like are used. Setting information indicating the pump output is output to the control portion 61 as operation data D21. A "start button," not shown, is provided in the operating part 21, and instructs a "start" instruction to the control portion 61.

The conveyance mechanism 70 is provided in the conveying portion 13, and is connected to the control unit 60. For the conveyance mechanism 70, a conveying device of walking beam type is used. The control unit 60 outputs a conveyance control signal S13 to the conveyance mechanism 70. The conveyance control signal S13 is a signal for allowing moving beams 18, 28 to be driven and allowing the workpiece 1 to be intermittently fed.

The preliminary heating portion 20 is connected to the control unit 60. The control unit 60 outputs a preliminary heating control signal S20 to the preliminary heating portion 20. The preliminary heating control signal S20 is a signal for allowing heaters, fans and the like in the preliminary heating portion 20 to be driven and controlling four preliminary heating zones I to IV so that the temperature of the workpiece 1 arrives at a predetermined temperature (for example, 180° C.).

The main heating portion 30 is connected to the control unit 60. The control unit 60 outputs a main heating control signal S30 to the main heating portion 30. The main heating control signal S30 is a signal for allowing heaters, fans and the like in the main heating portion 30 to be driven and heating the workpiece 1 to 250° C. The elevating mechanism 43 is connected to the control unit 60. The control unit 60 outputs an elevating control signal S43 to the elevating mechanism 43. The elevating control signal S43 is a signal for elevating the container 41.

The panel heater 44 is connected to the control unit 60. The control unit 60 outputs a heater control signal S44 to the panel heater 44. The heater control signal S44 is a signal for maintaining the inside of the tightly sealed container 41 at a predetermined temperature. The electromagnetic valve 22 is connected to the control unit 60. For the electromagnetic valve 22, a throttle valve for vacuum control is used. The control unit 60 outputs an electromagnetic valve control signal S22 to the electromagnetic valve 22. The electromagnetic valve control signal S22 is a signal for controlling valve opening of the electromagnetic valve 22.

The pump 23 evacuates the chamber 40 based on the evacuation conditions. The pump 23 is connected to the control unit 60. For the pump 23, a rotary type vacuum pump (blower), reciprocating vacuum pump (piston) or the like is used. The control unit 60 outputs a pump driving voltage V23 to the pump 23. In this embodiment, a scroll pump of oil-free type is used for explanation. When, for example, an alternative current motor, not shown, is used as a driving source of the pump 23, a variable voltage variable frequency (VVVF) inverter control system is adopted. According to this control system, voltage almost proportional to the number of revolutions and frequency f (for example, f=20 Hz through 60 Hz) of the alternative current motor is applied. The pump driving voltage V23 is voltage for controlling the output of the alternative current motor. The frequency is changed, whereby the number of revolutions of the motor is changed, and then the pump output is changed. Evacuation properties (i.e., properties represented by plotting the evacuation time relative to the degree of vacuum for each of the frequencies), which are obtained by evacuation of the chamber using a predetermined pump output, are expressed as #1, #2, #3 and #4 in FIG. 6, and are intrinsic for the respective frequencies.

The arrival sensor 26 is connected to the control unit 60. The arrival sensor 26 detects that the workpiece 1 has been imported into the vacuum reflow furnace 100, and outputs an arrival detection signal S26 indicating that the workpiece 1 has been imported into the vacuum reflow furnace 100 to the control unit 60. For the arrival sensor 26, a reflection type or transmission type optical sensor is used. In this embodiment, upon detection that the workpiece 1 has been imported into the vacuum reflow furnace 100, the arrival detection signal S26 is output to the control unit 60 to start a timer. A position of the workpiece 1 in the vacuum reflow furnace 100 is calculated from a conveying velocity of the workpiece 1 and the like based on this timer. In this embodiment in which the workpiece 1 is intermittently fed, since the time for intermittent-feeding is previously set, the position of the workpiece 1 may be calculated by the time for intermittent-feeding. Also, the amount of decrease in pressure per unit time for the selected pump output is monitored, and, when the amount of decrease in pressure per unit time has become smaller than the predetermined value, control is performed so that the pump output is sequentially switched to a pump output higher than the selected pump output among a plurality of pump outputs.

The vacuum pressure sensor 24 is connected to the control unit 60. The vacuum pressure sensor 24 constitutes one example of a detection section and detects the degree of vacuum in the chamber 40 during the defoaming and/or deaerating to generate a vacuum pressure detection signal S24 (pressure detection information). The vacuum pressure detection signal S24 is a signal indicating the degree of vacuum in the chamber 40, and is output from the vacuum pressure sensor 24 to the control unit 60. For the vacuum pressure sensor 24, a diaphragm vacuum gauge, a thermocouple vacuum gauge, a Pirani vacuum gauge, a Penning vacuum gauge or the like is used.

One end of the release valve 25 is connected to the gas-supplying port 203 of the base 42 shown in FIG. 2, and the other end thereof is connected to a gas-supplying portion 29 such as a $N_2$ (nitrogen) gas cylinder, not shown, a $H_2$ (hydrogen) gas cylinder, not shown, or the like. The gas-supplying portion 29 has a proportional solenoid valve, not shown. The gas-supplying portion 29 may supply at least one of $N_2$ gas (inert gas) and $H_2$ gas (activated gas for reducing) into the chamber 40. The proportional solenoid valve is configured so as to adjust inflow rate of $N_2$ gas or $H_2$ gas. The control unit 60 outputs a release valve control signal S25 to the release valve 25. The release valve control signal S25 is a signal for controlling the release valve 25.

For the release valve 25, for example, a valve having an initial release valve and a main release valve is used. The initial release valve has a predetermined aperture which is smaller than that of the main release valve. The initial release valve is used when limiting the inflow rate of the gas into the chamber 40 to be low or in a preceding operation of the main release valve. The main release valve has an aperture which is larger than that of the initial release valve so that a higher inflow rate of the gas is passed through, as compared with the initial release valve. Controlling the release valve 25 enables the inside of the chamber 40 to be adjusted to multiple stages of the target vacuum pressure (Pa) during pressure reduction.

The cooling portion 50 is connected to the control unit 60. The control unit 60 outputs a cooling control signal S50 to the cooling portion 50. The cooling control signal S50 is a signal for controlling heat exchangers, fans and the like. The cooling system of the cooling portion 50 is a turbo fan (under nitrogen atmosphere).

The control unit 60 has the control portion 61, the storage portion 62 and the timing generation portion 63. The control unit 60 is also provided with an analog to digital converter, an oscillator, not shown and the like. The storage portion 62 is connected to the control portion 61 and stores control data D62.

The control data D62 includes the data for controlling the preliminary heating portion 20, the electromagnetic valve 22, the release valve 25, the main heating portion 30, the elevating mechanism 43, the panel heater 44, the cooling portion 50 and the conveyance mechanism 70. For the storage portion 62, a read only memory (ROM), a random access memory (RAM), a hard disk drive (HDD) or the like is used.

For the control portion 61, a central processing unit (CPU) is used. The control portion 61 starts evacuation using the pump output set in the operating part 21, then calculates the amount of decrease in degree of vacuum per unit time after a predetermined elapsed time from the output of the vacuum pressure sensor 24 or the like, and sets this value as a reference value Xrf (Pa/sec). When the amount of decrease X in degree of vacuum per unit time has become smaller than the reference value Xrf, the pump output is sequentially switched to a higher output. Thus, evacuation control is performed along the initial virtual asymptotic line when evacuation of the chamber 40 has been started from an atmospheric pressure state.

The control portion 61 adjusts the degree of vacuum based on the vacuum pressure detection signal S24 and controls the electromagnetic valve 22 and the release valve 25, in addition to the pump 23, to keep the degree of vacuum for a predetermined time. This makes it possible to increase the selectivity of the evacuation conditions and to quickly evacuate the chamber to the specified set target pressure Pf. Further, the voids 2 in the molten solder 7 can be gradually defoamed and/or deaerated. Accordingly, it is possible to prevent splashing of flux, solder scattering and the like caused by break (burst) of the voids 2.

In addition to the storage portion 62, the timing generation portion 63 is connected to the control portion 61. The timing generation portion 63 receives a reference clock signal obtained from an oscillator, not shown, and a control instruction from the control portion 61, and generates the preliminary heating control signal S20, the electromagnetic valve control signal S22, the release valve control signal S25, the main heating control signal S30, the elevating control signal S43, the heater control signal S44, the cooling control signal S50 and a conveyance control signal S70. Thus, the control system of the vacuum reflow furnace 100 is configured.

Figure 5:
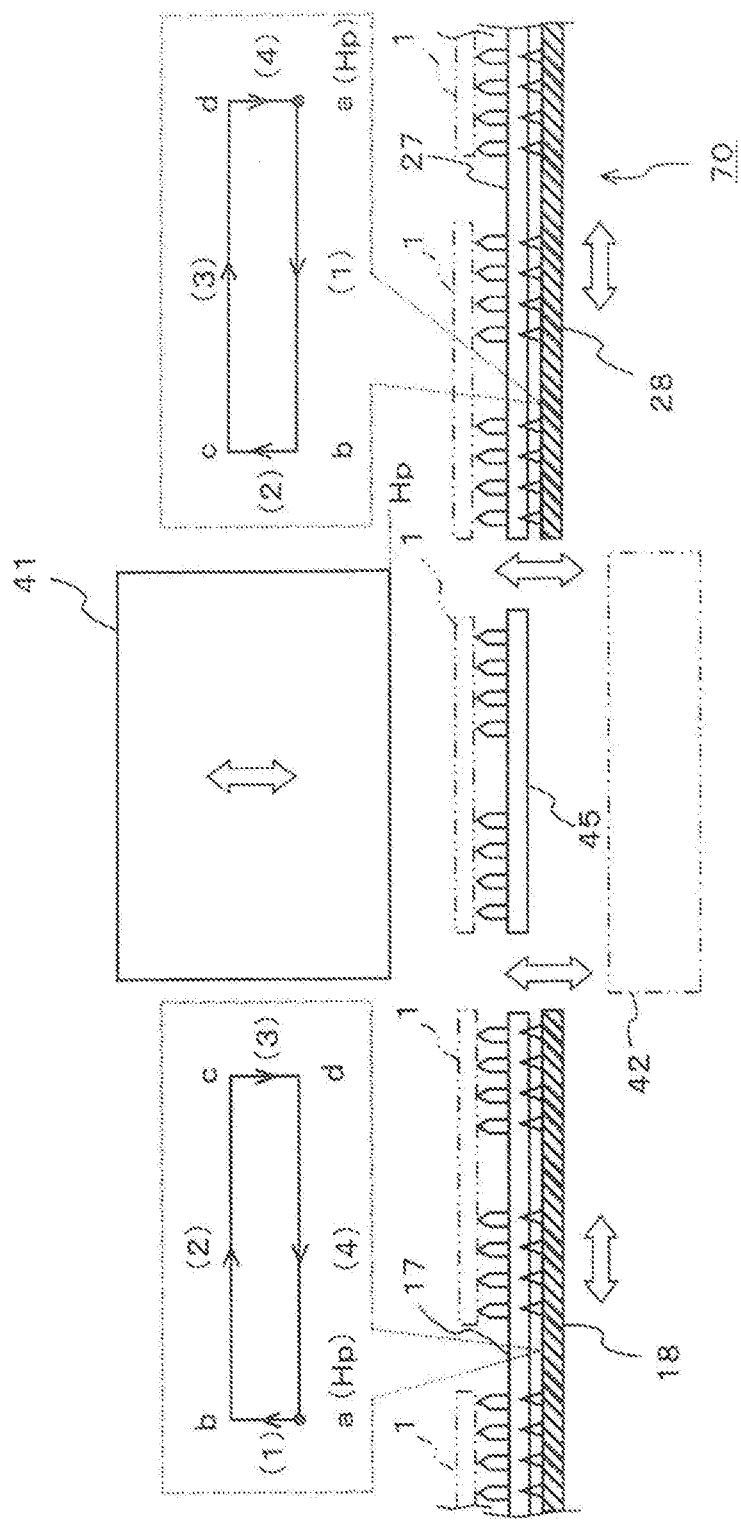
FIG. 5 is a cross sectional view of a conveying portion 13 for showing a configuration example thereof.

The following will describe a configuration example of the conveyance mechanism 70 with reference to FIG. 5. In FIG. 5, the conveyance mechanism 70 of a walking beam type has fixed beams 17, 27 and moving beams 18, 28. Feeding pitch of the moving beams 18, 28 is about 400 mm, for example. Here, based on the chamber 40, a side at which the workpiece 1 is imported is set to be an "import side" and a side at which the workpiece 1 is exported is set to be an "export side". The fixed beam 17 on the import side is provided in the preliminary heating portion 20 and the main heating portion 30 shown in FIG. 1. The fixed beam 27 on the export side is provided in the cooling portion 50.

Pairs of the fixed beams 17, 27 are provided on both sides of the conveying path 16 one by one. The moving beams 18, 28 act to move up and down, right and left relative to the fixed beams 17, 27 of both sides (refer to loci (1) through (4) in the figure: walking). A symbol "a" indicates a home position Hp of each of the moving beams 18, 28. The moving beams 18, 28 are respectively configured to be driven independently on the import side and the export side.

For example, the moving beam 18 on the import side lifts up vertically ("a" to "b") along the locus (1) and receives the workpiece 1 from the fixed beam 17 (fixed beam 45). Next, the moving beam 18 moves horizontally ("b" to "c") along the locus (2) with the workpiece 1 mounted; the moving beam 18 descends vertically ("c" to "d") along the locus (3) and mounts the workpiece 1 on the fixed beam 17 (fixed beam 45); the moving beam 18 then moves horizontally ("d" to "a") along the locus (4) and returns to the home position Hp. Thus, it intermittently feeds the workpiece 1 sequentially.

In addition, the moving beam 28 on the export side moves horizontally ("a" to "b") along the locus (1). Next, it lifts up vertically ("b" to "c") along the locus (2). This allows the moving beams 28 to receive the workpiece 1 from the fixed beam 45 (fixed beam 27). The moving beam 28 then moves horizontally ("c" to "d") along the locus (3) with the workpiece 1 mounted. The moving beam 28 then descends vertically ("d" to "a") along the locus (4) and mounts the workpiece 1 on the fixed beam 27, and then returns to the home position Hp. Thus, it intermittently feeds the workpiece 1 sequentially at a predetermined conveying velocity (on the figure, the workpiece 1 is carried sequentially from the left side to the right side). Accordingly, the conveyance mechanism 70 of a walking beam type is configured.

Figure 6:
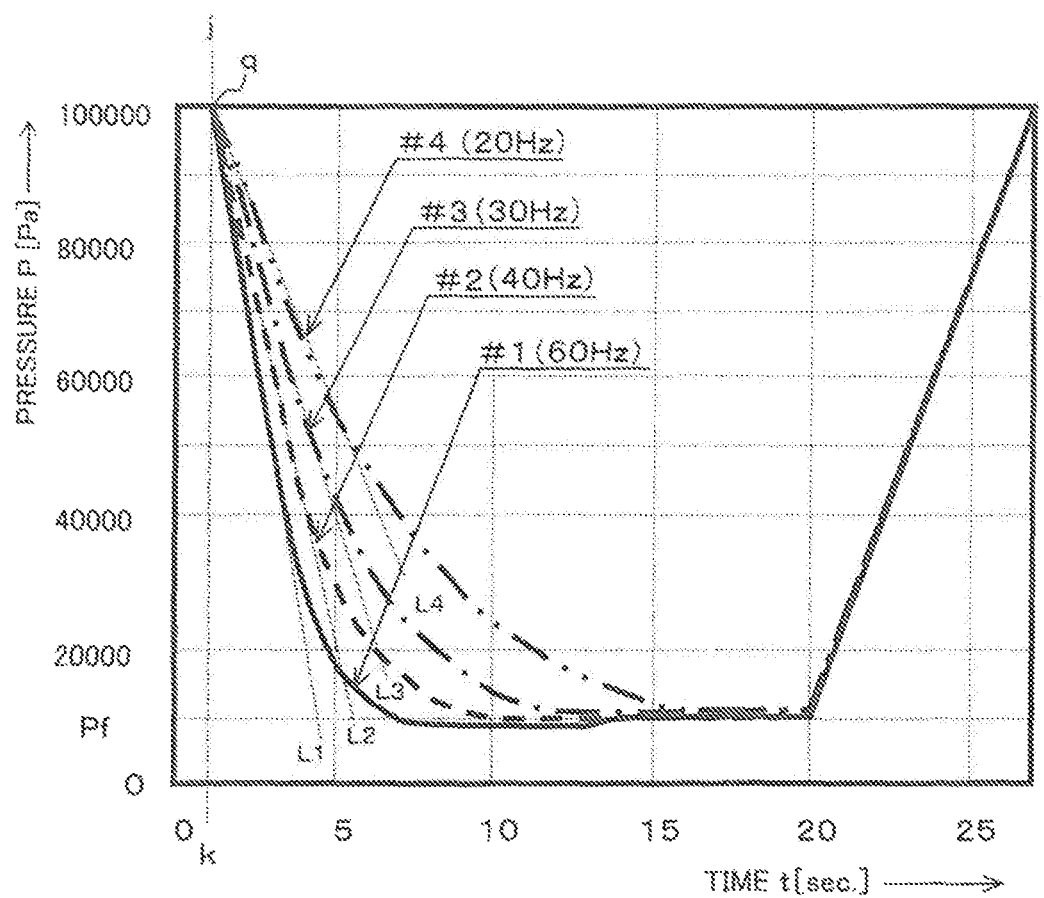
FIG. 6 is a graph chart showing examples of evacuation control properties #1 to #4.

The following will describe evacuation control properties #1 through #4 with reference to FIG. 6. In FIG. 6, the vertical axis indicates pressure P [Pa] (degree of vacuum) in the chamber. The horizontal axis indicates time "t" [sec.] which is required for evacuation. Pf indicates the set target pressure which is 10000 [Pa], in this embodiment. Further, the time t when the container 41 starts to move toward the side of the base 42 by the elevating mechanism 43 in order to close the chamber 40 is set to be zero (t=0) in a time axis shown in FIG. 6. The time t when the chamber 40 is closed is set to be k (t=k). This is because the evacuation is actually started since t=k. The following elapsed times are indicated based on t=k.

In this embodiment, the vacuum pump operating frequencies are set to be selectable from 20 Hz, 30 Hz, 40 Hz and 60 Hz as a plurality of pump outputs. In this embodiment, a solid line indicates the evacuation control property #1 in a case where the alternative current motor is driven at a frequency of 60 Hz (f=60 Hz), and the pump 23 is operated to evacuate the chamber 40. The control property #1 is a property where it is possible to evacuate the chamber 40 by taking about 6 [sec.] to reach the set target pressure Pf. A broken line indicates the evacuation control property #2 in a case where the pump 23 is similarly operated at a frequency of 40 Hz (f=40 Hz) to evacuate the chamber 40. The control property #2 is a property where it is possible to evacuate the chamber 40 by taking about 9 [sec.] to reach the set target pressure Pf.

A dashed-dotted line indicates the evacuation control property #3 in a case where the pump 23 is similarly operated at a frequency of 30 Hz (f=30 Hz) to evacuate the chamber 40. The control property #3 is a property where it is possible to evacuate the chamber 40 by taking about 11 [sec.] to reach the set target pressure Pf. A dashed-two dotted line indicates the evacuation control property #4 in a case where the pump 23 is similarly operated at a frequency of 20 Hz (f=20 Hz) to evacuate the chamber 40. The control property #4 is a property where it is possible to evacuate the chamber 40 by taking about 16 [sec.] to reach the set target pressure Pf.

The frequency f for obtaining a pump output Po1 is 60 Hz; the frequency f for obtaining a pump output Po2 is 40 Hz; the frequency f for obtaining a pump output Po3 is 30 Hz; and the frequency f for obtaining a pump output Po4 is 20 Hz. Magnitude correlation of these pump outputs Po1 through Po4 is indicated as Po1>Po2>Po3>Po4 in a case of pump output Po; 60 Hz>40 Hz>30 Hz>20 Hz in a case of frequency f.

L1 in the figure represents an initial virtual asymptotic line in the evacuation control property #1. The asymptotic line L1 is a tangential line at an intersection q between a line segment j-k (broken line) parallel to the vertical axis and the graph of the evacuation control property #1. L2 represents an initial virtual asymptotic line in the evacuation control property #2. The asymptotic line L2 is a tangential line at the intersection q between the line segment j-k and the graph of the evacuation control property #2. L3 represents an initial virtual asymptotic line in the evacuation control property #3. The asymptotic line L3 is a tangential line at the intersection q between the line segment j-k and the graph of the evacuation control property #3. L4 represents an initial virtual asymptotic line in the evacuation control property #4. The asymptotic line L4 is a tangential line at the intersection q between the line segment j-k and the graph of the evacuation control property #4. It is to be noted that the line segment j-k is used as a reference based on the fact that t=k where evacuation is actually started is used as the starting point of the elapsed time as described above.

While the evacuation properties are different and intrinsic for the respective pumps and the vacuum pump operating frequencies, it is understood, according to the evacuation properties #1 through #4 at the respective frequencies, that the amount of decrease in pressure per unit time is displaced along the virtual asymptotic lines (L1, L2, L3, L4) at an initial stage where the evacuation is started from an atmospheric pressure, but tends to be greatly separated away from each of the virtual asymptotic lines as the vacuum pressure approaches the target degree of vacuum. Also, it is understood that, as the pump output is higher, the virtual asymptotic line is inclined greatly.

Executed Example 1

Figure 7:
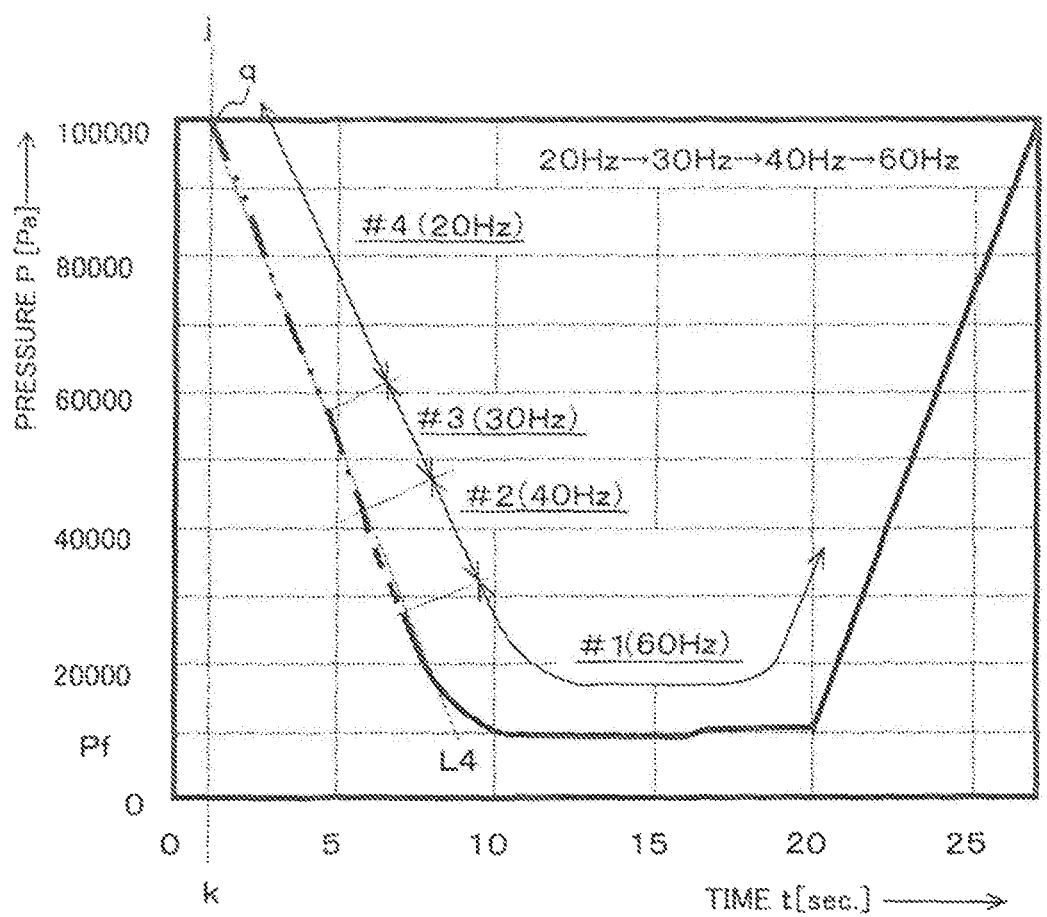
FIG. 7 is a graph showing a control example of the chamber 40 (20 Hz→30 Hz→40 Hz→60 Hz).

According to a control example (1) of the chamber 40 shown in FIG. 7, four evacuation control properties #1 through #4 are switched. In the evacuation of the chamber 40, the frequency of the pump driving system is controlled so that the frequency is gradually increased from 20 Hz to 60 Hz through 30 Hz and 40 Hz, and the pump output control is performed by switching the evacuation control properties in order from #4 to #1.

The pump 23 is driven after the evacuation control property #4 (20 Hz) at the same time as the control starts. The pump 23 is driven at the frequency f of 20 Hz (f=20 Hz) for about 1 second. On the other hand, the control portion 61 calculates the amount of decrease in degree of vacuum per unit time from the output of the vacuum pressure sensor 24 or the like, after elapse of about 1 second from the beginning of drive at the frequency f=20 Hz, and sets this value as a reference value Xrf (Pa/sec).

When the reference value Xrf is set, the frequency of the pump driving system is switched to f=30 Hz so that the control property is switched from the evacuation control property #4 to the evacuation control property #3. The evacuation property is switched from #4 to #3 so that the amount of decrease X in degree of vacuum per unit time becomes larger than the reference value Xrf. In this example, an explanation has been given, taking, as an example, the case where the reference value Xrf (Pa/sec) is set at the frequency f=20 Hz and, immediately after the setting, the control is performed to switch to the second highest frequency f=30 Hz. However, the switching point may be set more flexibly with a range, and the control may be performed by switching from f=20 Hz to f=30 Hz at a point smaller than the reference value Xrf which is set at the frequency f=20 Hz.

When it starts to drive at the frequency f=30 Hz, the control portion 61 calculates the amount of decrease in degree of vacuum per unit time from the output of the vacuum pressure sensor 24 or the like. When the amount of decrease X in degree of vacuum per unit time has become smaller than the reference value Xrf, the frequency of the pump driving system is switched to f=40 Hz so that the control property is switched from the evacuation control property #3 to the evacuation control property #2. The evacuation property is switched from #3 to #2 so that the amount of decrease X in degree of vacuum per unit time becomes larger than the reference value Xrf.

When it starts to drive at the frequency f=40 Hz, the control portion 61 calculates the amount of decrease in degree of vacuum per unit time from the output of the vacuum pressure sensor 24 or the like. When the amount of decrease X in degree of vacuum per unit time has become smaller than the reference value Xrf, the frequency of the pump driving system is switched to f=60 Hz so that the control property is switched from the evacuation control property #2 to the evacuation control property #1.

Thus, the pump output is switched so that the amount of decrease X in degree of vacuum per unit time approaches the reference value Xrf. The reference value Xrf is a value indicating the amount of decrease in degree of vacuum per unit time in the initial virtual asymptotic line, and evacuation control along the initial virtual asymptotic line is performed, thereby making it possible to quickly evacuate the chamber 40 to the specified set target pressure Pf. In this example, it takes about 9 [sec.] for the chamber 40 to reach the set target pressure Pf from the beginning of evacuation.

Executed Example 2

Figure 8:
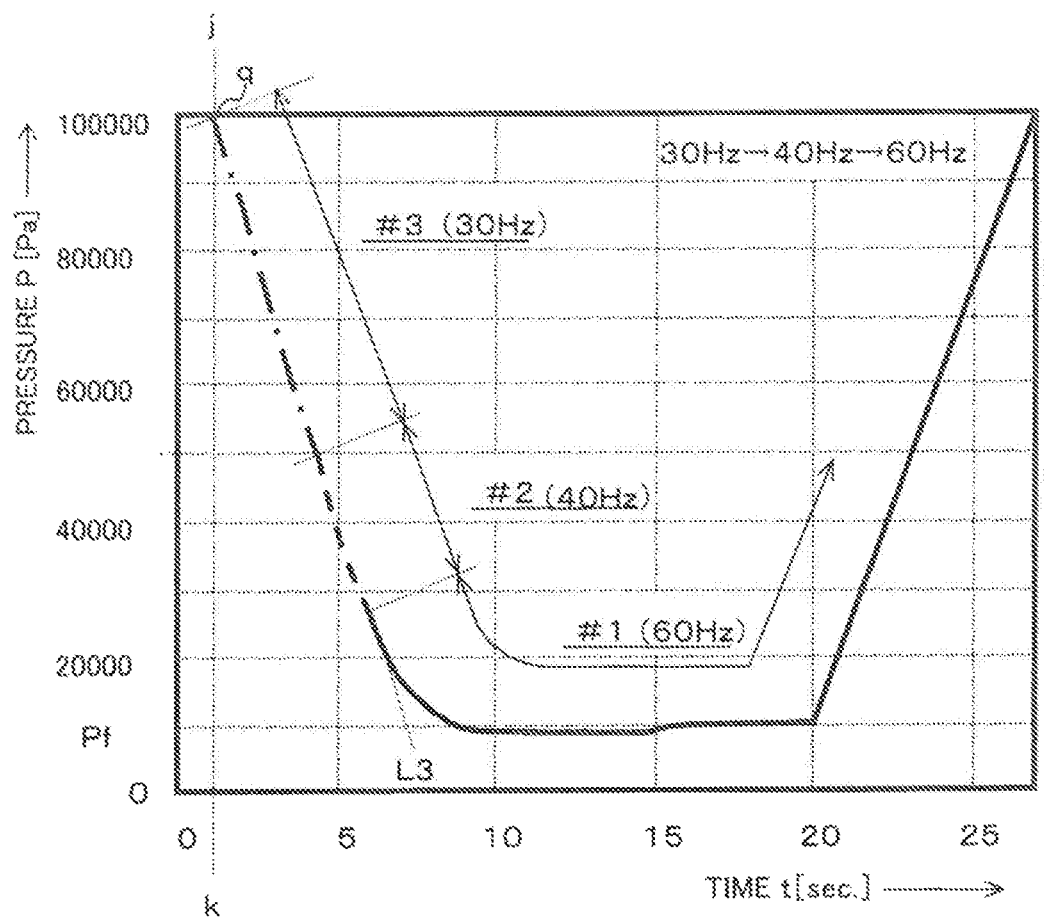
FIG. 8 is a graph showing a control example of the chamber 40 (30 Hz→40 Hz→60 Hz).

According to a control example (2) of the chamber 40 shown in FIG. 8, three evacuation control properties #1 through #3 are switched. In the evacuation of the chamber 40, in order to perform a control such that the frequency of the pump driving system is gradually increased from 30 Hz to 60 Hz through 40 Hz, the pump output control is performed by switching the evacuation control properties in order from #3 to #1.

At the same time as the control starts, the pump 23 is driven after the evacuation control property #3 (30 Hz). The pump 23 is driven at the frequency f=30 Hz for about 1 second. On the other hand, the control portion 61 calculates the amount of decrease in degree of vacuum per unit time from the output of the vacuum pressure sensor 24 or the like, after the elapse of about 1 second from the beginning of drive at the frequency f=30 Hz, and sets this value as a reference value Xrf (Pa/sec).

When the reference value Xrf is set, the frequency of the pump driving system is switched to f=40 Hz so that the control property is switched from the evacuation control property #3 to the evacuation control property #2. The evacuation property is switched from #3 to #2 so that the amount of decrease X in degree of vacuum per unit time becomes larger than the reference value Xrf. Also in this example, an explanation has been given, taking, as an example, the case where the reference value Xrf (Pa/sec) is set at the frequency f=30 Hz and, after the setting, the frequency is controlled to be immediately switched to the second highest frequency f=40 Hz. However, the switching point may be set more flexibly with a range, and the control may be performed by switching from f=30 Hz to f=40 Hz at a point smaller than the reference value Xrf which is set at the frequency f=30 Hz.

When it starts to drive at the frequency f=40 Hz, the control portion 61 calculates the amount of decrease in degree of vacuum per unit time from the output of the vacuum pressure sensor 24 or the like. When the amount of decrease X in degree of vacuum per unit time has become smaller than the reference value Xrf, the frequency of the pump driving system is switched to f=60 Hz so that the control property is switched from the evacuation control property #2 to the evacuation control property #1.

Thus, the pump output is switched so that the amount of decrease X in degree of vacuum per unit time approaches the reference value Xrf. The reference value Xrf is a value indicating the amount of decrease in degree of vacuum per unit time in the initial virtual asymptotic line, and evacuation control along the initial virtual asymptotic line is performed, thereby making it possible to quickly evacuate the chamber 40 to the specified set target pressure Pf. In this example, it takes about 8 [sec.] for the chamber 40 to reach the set target pressure Pf from the beginning of evacuation.

Figure 9:
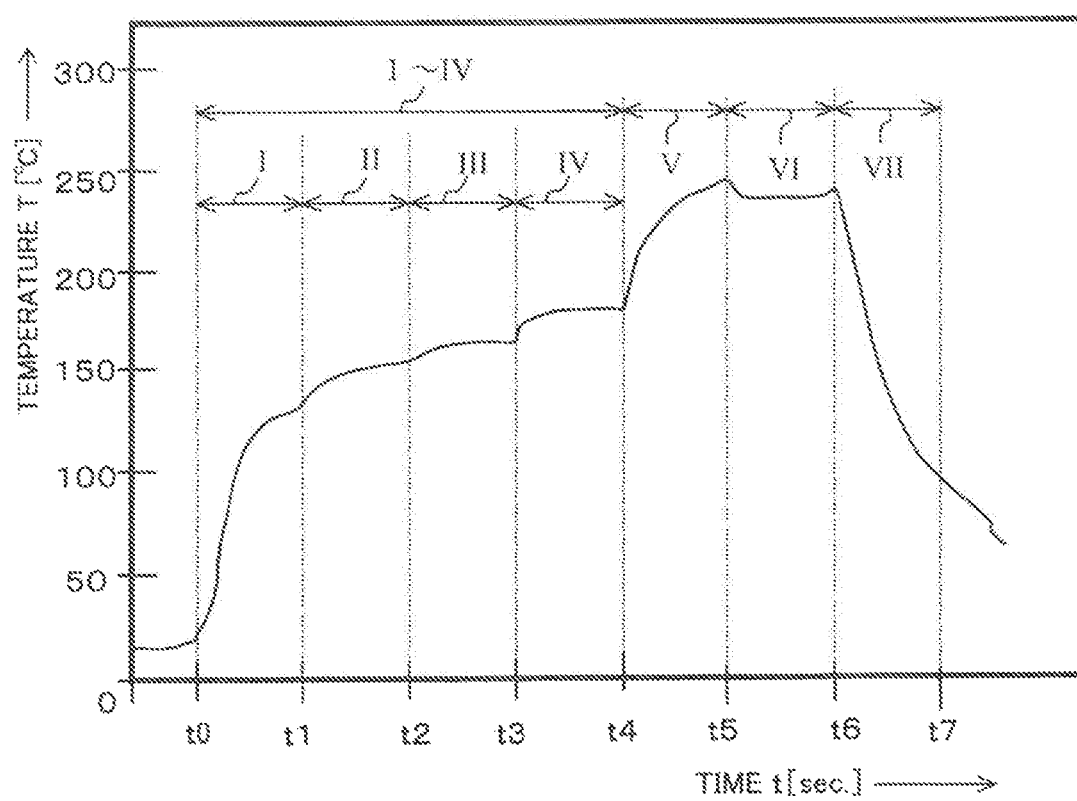
FIG. 9 is a graph showing a temperature profile of the vacuum reflow furnace 100.

The following will describe a control example of the vacuum reflow furnace 100 with reference to FIG. 9, FIG. 10, FIG. 11, FIG. 12A, FIG. 12B, FIG. 13A and FIG. 13B in connection with a method for controlling the vacuum soldering device according to the present invention. FIG. 9 shows a temperature profile of the vacuum reflow furnace 100. In FIG. 9, the vertical axis indicates a workpiece temperature T [° C.] in the preliminary heating zones I to IV, main heating zone V, vacuum defoaming and/or deaerating zone VI and cooling zone VII, and the horizontal axis indicates elapsed times t1 through t7 [sec.]. The heavy curve in the figure indicates the workpiece temperature property in the vacuum reflow furnace 100.

The flowcharts shown in FIG. 10, FIG. 11, FIG. 12A, FIG. 12B, FIG. 13A and FIG. 13B illustrate control examples using the workpiece 1 as a reference, and the processing of the other workpieces 1 is progressing simultaneously at the import side and export side of the chamber 40. However, for easy-to-understand explanation, an explanation will be given, focusing on the movement of one workpiece 1 at the stages preceding and subsequent, respectively, to the chamber 40.

The following evacuation conditions are set on the control portion 61.

i. The operating part 21 accepts settings for the evacuation control. For example, a case where four vacuum pump operating frequencies, 20 Hz, 30 Hz, 40 Hz and 60 Hz, are selected as the pump output and a case where three vacuum pump operating frequencies, 30 Hz, 40 Hz and 60 Hz, are selected as the pump output are exemplified.

ii. Before being charged into the chamber 40, the workpiece 1 is heated up to a predetermined temperature.

iii. When the workpiece 1 has been charged into the chamber 40, the predetermined temperature of the workpiece 1 before it is charged into the chamber 40 is kept.

iv. The control portion 61 starts drive at a vacuum pump operating frequency at which the output becomes lowest among the selected pump outputs. The control portion 61 calculates the amount of decrease X in degree of vacuum per unit time in real time, and always compares the amount of decrease X in degree of vacuum per unit time calculated in real time with the reference value Xrf set by calculating the amount of decrease in degree of vacuum per unit time in a predetermined initial state at the beginning of the evacuation, and, when the amount of decrease X has become smaller than the reference value Xrf during evacuation, the control is switched from an evacuation control property involving a low pump output to an evacuation control property involving a high pump output.

Figure 10:
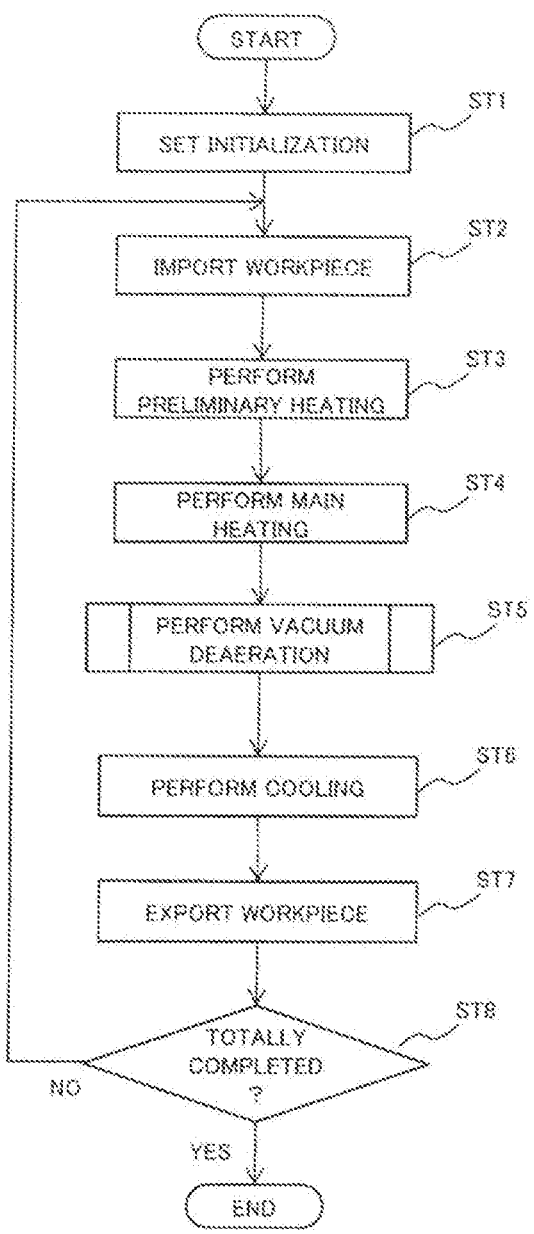
FIG. 10 is a flowchart showing a control example (main routine) of the vacuum reflow furnace 100.

These conditions are defined as conditions for controlling vacuum soldering, and the control portion 61 accepts initial settings at a step ST1 shown in FIG. 10. In the initial settings, the operating part 21 is used to select a desired vacuum pump operating frequency from 20 Hz, 30 Hz, 40 Hz and 60 Hz, as the pump output. The control portion 61 initializes the evacuation control properties in the ascending order of the frequency for the pump output, among the pump outputs selected by a user. The setting information obtained therein is output to the control portion 61 as the operation data D21.

At a step ST2, the control portion 61 allows the workpiece 1 to be imported. The workpiece 1 is imported, for example, by user's depression of a start button provided in the operating part 21. When start is instructed, the control portion 61 executes drive control of the conveyance mechanism 70. At this time, the conveyance mechanism 70 receives the conveyance control signal S13 from the control unit 60 to drive the moving beams 18, 28 based on the conveyance control signal S13, thereby intermittently feeding the workpiece 1. The intermittent-feeding operation is not explained because it is not essential for the present invention. Upon detection that the workpiece 1 has been imported to the vacuum reflow furnace 100, the arrival detection signal S26 is output to the control unit 60 to start the timer. A position of the workpiece 1 can be calculated from the intermittent-feeding time based on this timer.

At a step ST3, the control portion 61 executes preliminary heating of the workpiece 1. At this time, the preliminary heating portion 20 receives the preliminary heating control signal S20 from the control unit 60 to drive four preliminary heating zones I to IV based on the preliminary heating control signal S20, thereby gradually heating the workpiece 1 (about 130° C. to 180° C. through 160° C. and 170° C.) so that the workpiece 1 arrives at a predetermined temperature (for example, 180° C.).

For example, in the preliminary heating zone I, the inside of the furnace is heated from the ordinary temperature to a temperature of around 130° C., according to the temperature profile shown in FIG. 9, in a period of time between the elapsed time t0 and the elapsed time t1. In the preliminary heating zone II, the inside of the furnace is heated from the temperature of 130° C. to a temperature of around 160° C. in a period of time between the elapsed time t1 and the elapsed time t2. In the preliminary heating zone III, the inside of the furnace is heated to a temperature of around 160° C. to around 170° C. in a period of time between the elapsed time t2 and the elapsed time t3. In the preliminary heating zone IV, the inside of the furnace is heated to a temperature of around 170° C. to around 180° C. in a period of time between the elapsed time t3 and the elapsed time t4.

At a step ST4, the control portion 61 executes main heating of the workpiece 1. At this time, the main heating portion 30 receives the main heating control signal S30 from the control unit 60 to operate heaters, fans and the like in the main heating portion 30 based on the main heating control signal S30, thereby heating the workpiece 1 to 250° C. According to the temperature profile shown in FIG. 9, in the main heating zone V, the inside of the furnace is heated to a temperature of around 230° C. to around 260° C. in a period of time between the elapsed times t4 and t5.

At a step ST5, the control portion 61 executes vacuum deaeration of the workpiece 1. Due to the vacuum deaeration in this example, the process is shifted to a subroutine shown in FIG. 11.

The process is shifted to a step ST61 in which the control portion 61 executes descendent control of the container 41 (chamber descent). The elevating mechanism 43 receives the elevating control signal S43 from the control unit 60 to drive a cylinder, not shown, and the like so that the container 41 is brought into a tightly sealed state.

Further, the panel heater 44 is configured to receive the heater control signal S44 from the control unit 60 and to keep the temperature of the workpiece 1 at 240° C. based on the heater control signal S44. In this example, in the vacuum defoaming and/or deaerating zone VI shown in FIG. 9, the inside the container 41 is kept at a temperature of around 230° C. to around 250° C. in a period of time between the elapsed times t5 and t6.

Thereafter, at a step ST62, the control portion 61 branches the control in response to whether the evacuation control property #4 has been initialized based on the pump output selected by a user or the evacuation control property #3, other than this, has been initialized. For example, when four evacuation control properties #1 through #4 have been selected and the evacuation control property #4 has been initialized, the process is shifted to a step ST63 in which the control portion 61 executes the evacuation control property #4.

Figure 12A:
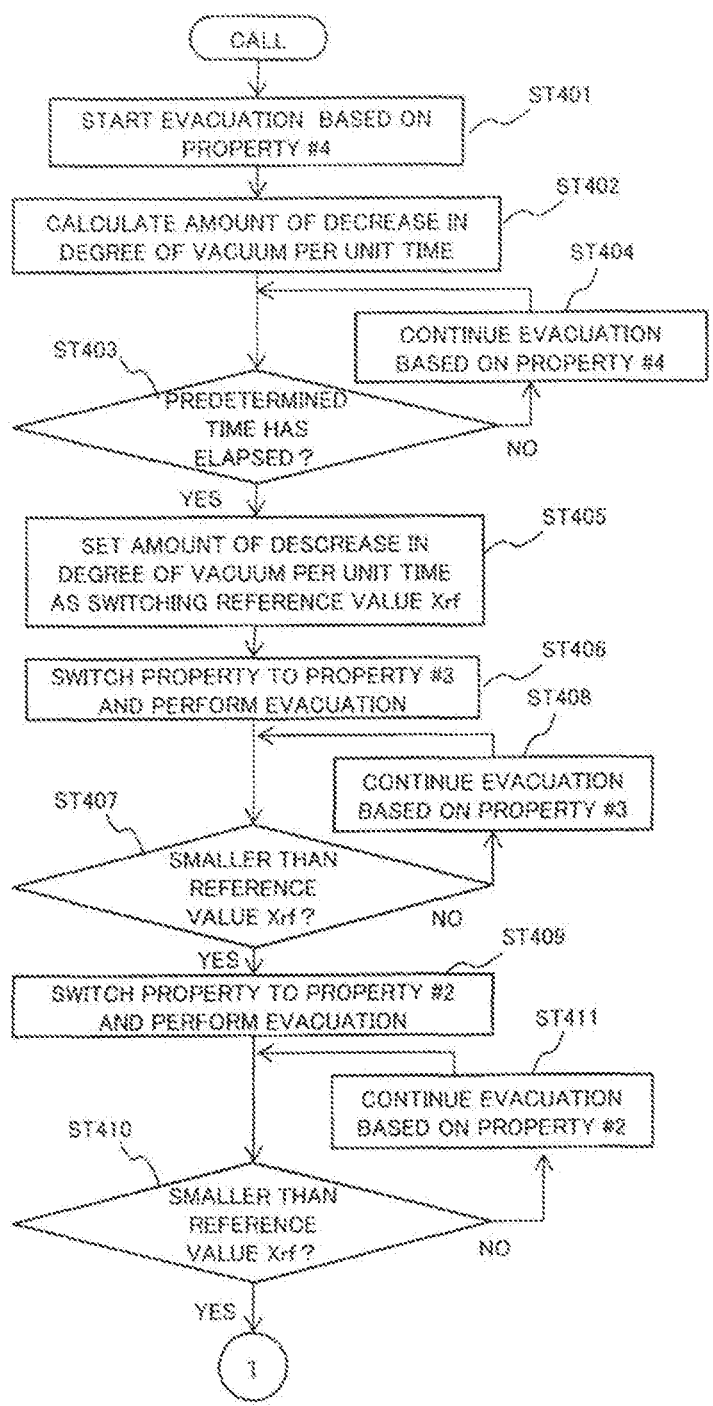
FIG. 12A is a flowchart showing a control example of the vacuum reflow furnace 100.
Figure 12B:
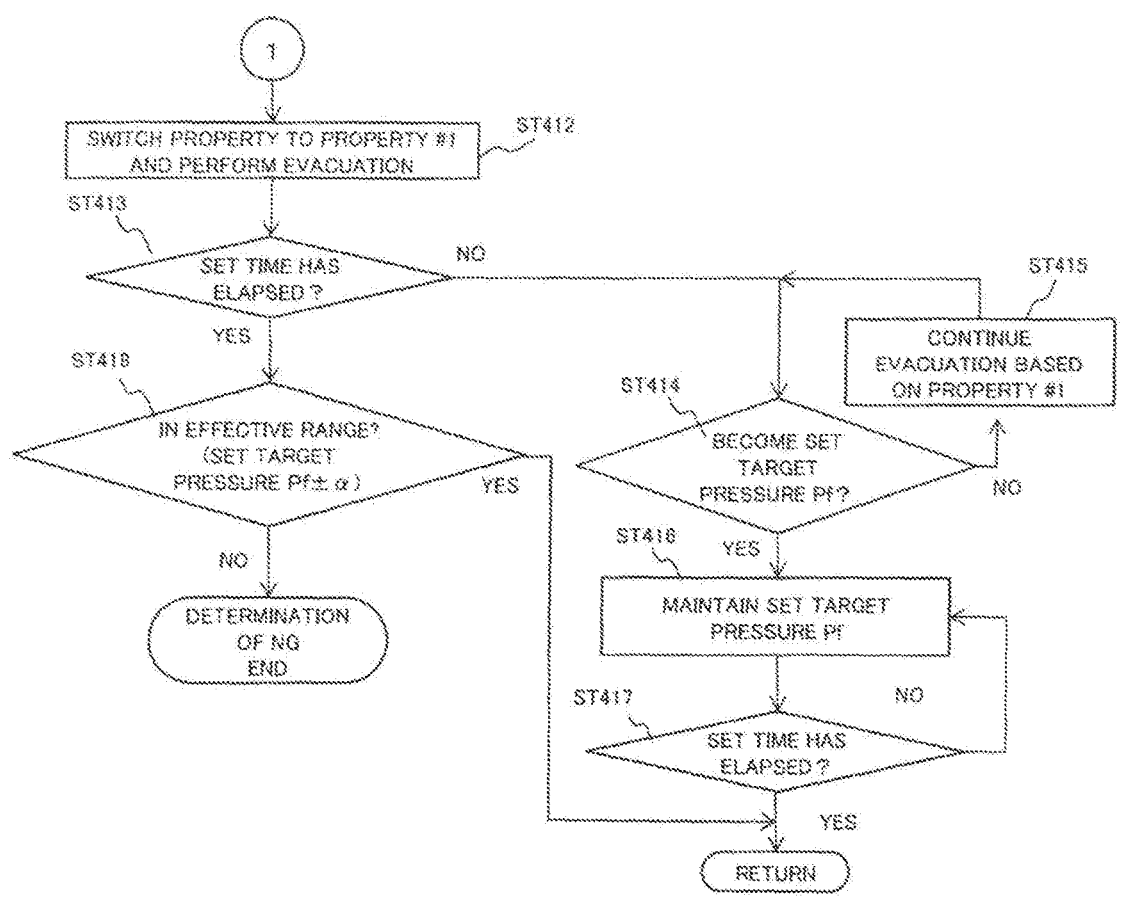
FIG. 12B is a flowchart showing a control example of the vacuum reflow furnace 100.

In this example, the process is shifted to a subroutine, as shown in FIG. 12A and FIG. 12B, in which the control portion 61 controls the pump output based on the evacuation control property #4 as shown in FIG. 7 at a step ST401. At the same time as the control starts, the pump 23 is driven after the evacuation control property #4 (20 Hz) so that the chamber 40 is evacuated.

In this evacuation, the release valve 25 receives the release valve control signal S25 from the control unit 60 so that both of the initial release valve and the main release valve are "fully closed". Also, the electromagnetic valve 22 receives the electromagnetic valve control signal S22 from the control unit 60, and is driven so as to attain the valve opening="full opening" based on the electromagnetic valve control signal S22.

Then, the control portion 61 controls the electromagnetic valve 22 and the pump 23 for evacuation of the chamber 40. Around the same time as the valve opening="full opening" has been attained, the pump 23 receives the pump drive voltage V23 from the control unit 60 and evacuates the chamber 40 based on the pump drive voltage V23. For example, the pump 23 acts to withdraw the air within the container 41 in a sucking amount along the evacuation control property #4 (20 Hz).

Next, at a step ST402, the control portion 61 calculates, in real time, the amount of decrease in degree of vacuum per unit time at every predetermined interval.

When the elapsed time has not reached the predetermined elapsed time yet at a step ST403, the process is shifted to a step ST404 in which evacuation based on the evacuation control property #4 is continued. When the elapsed time has reached the predetermined elapsed time at the step ST403, the process is shifted to a step ST405 in which the control portion 61 sets, as a reference value Xrf, the amount of decrease in degree of vacuum per unit time calculated when the elapsed time has reached the predetermined elapsed time. Then, at a step ST406, the evacuation control property is switched from #4 to #3. In the evacuation control property #3, the pump 23 is driven after the evacuation control property #3 (30 Hz).

At a step ST407, the control portion 61 compares the amount of decrease X in degree of vacuum per unit time calculated in real time with the reference value Xrf as to whether or not the calculated amount of decrease X is smaller than the reference value Xrf.

When the calculated amount of decrease X is equal to or larger than the reference value Xrf, the evacuation based on the evacuation control property #3 is continued at a step ST408. When the amount of decrease X calculated at the step ST407 is smaller than the reference value Xrf, the process is shifted to a step ST409 in which the control portion 61 switches the evacuation control property from #3 to #2. In the evacuation control property #2, the pump 23 is driven after the evacuation control property #2 (40 Hz).

At a step ST410, the control portion 61 compares the amount of decrease X in degree of vacuum per unit time calculated in real time with the reference value Xrf as to whether or not the calculated amount of decrease X is smaller than the reference value Xrf.

When the calculated amount of decrease X is equal to or larger than the reference value Xrf, the process is shifted to a step ST411 in which the evacuation based on the evacuation control property #2 is continued. When the amount of decrease X calculated at the step ST410 is smaller than the reference value Xrf, the process is shifted to a step ST412 in which the control portion 61 switches the evacuation control property from #2 to #1. In the evacuation control property #1, the pump 23 is driven after the evacuation control property #1 (60 Hz).

At a step ST413, the control portion 61 branches the control in response to whether the time preset as the evacuation time has elapsed (elapse of the set time). When the set time has not elapsed yet, the control portion 61 branches the control, at a step ST414, in response to whether the chamber 40 has arrived at the set target pressure Pf (for example, Pf=10000 [Pa]). When the chamber 40 has not arrived at the set target pressure Pf yet at the step ST414, the evacuation based on the evacuation control property #1 is continued at a step ST415, and the process is returned to the step ST414. When the chamber 40 has arrived at the set target pressure Pf at the step ST414, the set target pressure Pf is maintained (a step ST416), but, at a next step ST417, the control is branched in response to whether the time set as the evacuation time has elapsed (elapse of the set time). When the set time has not elapsed yet, control is performed so that the process is returned to the step ST416. When the time set as the evacuation time has elapsed (elapse of the set time) at the step ST417, vacuum break at a step ST64 shown in FIG. 11 is started.

Also, when the control portion 61 has determined that the time set as the evacuation time has elapsed (elapse of the set time) at the step ST413, the process is shifted to a step ST418. At this step ST418, the pressure within the chamber at the current moment is measured. When the measured current pressure falls within a set effective range (in the case of this example, range of the set target pressure Pf±1000 (Pa)), processing of regarding vacuum-processing as valid is performed, and then vacuum break at the step ST64 shown in FIG. 11 is started. When the control portion 61 has determined that the current pressure falls outside the set effective range at the step ST418, processing of regarding vacuum-processing as invalid (NG) is performed. When the determination of invalidity (NG) has been made, the result of invalidity (NG) may be informed, for example, by means of alert.

By this evacuation control, it is possible to evacuate the chamber 40 quickly to the specified set target pressure Pf via the evacuation control properties #4 to #1 through #3 and #2.

When any evacuation control property other than the evacuation control property #4 has been initialized at the above-described step ST62 shown in FIG. 11, the process is shifted to a step ST65 in which the control portion 61 executes the evacuation control property #3, in this example.

Figure 13A:
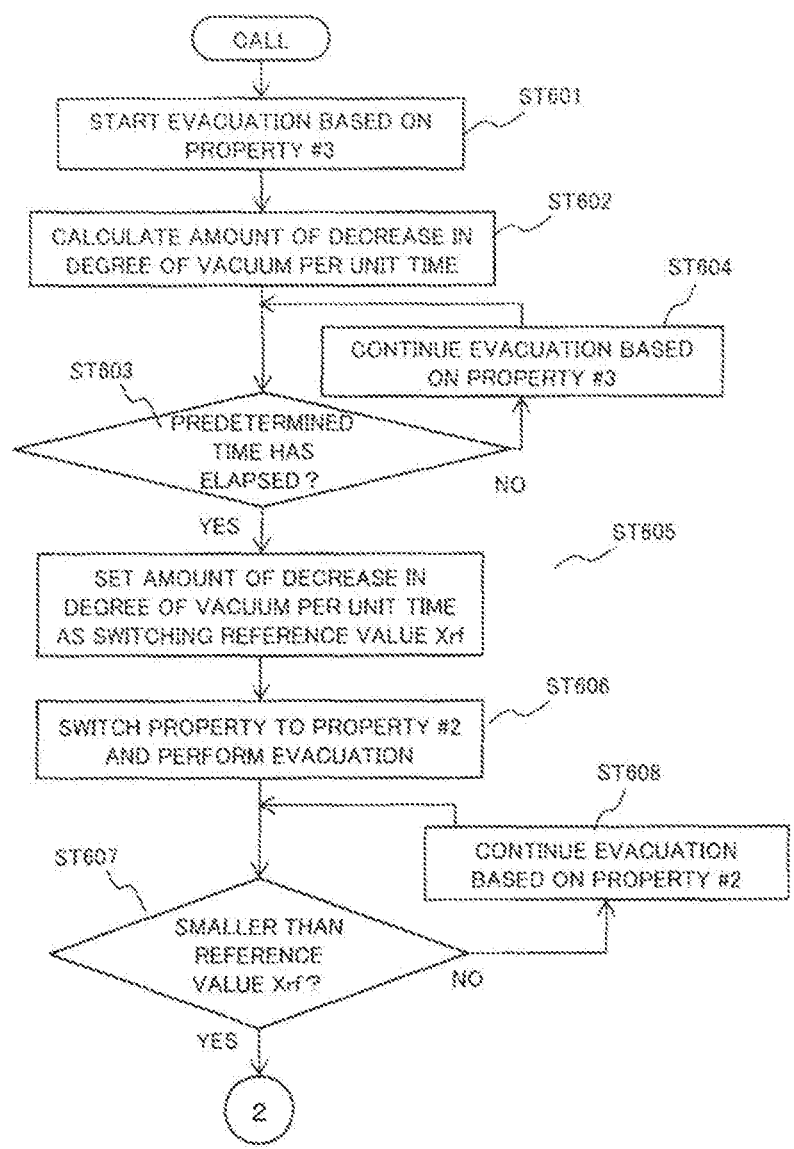
FIG. 13A is a flowchart showing a control example of the vacuum reflow furnace 100.
Figure 13B:
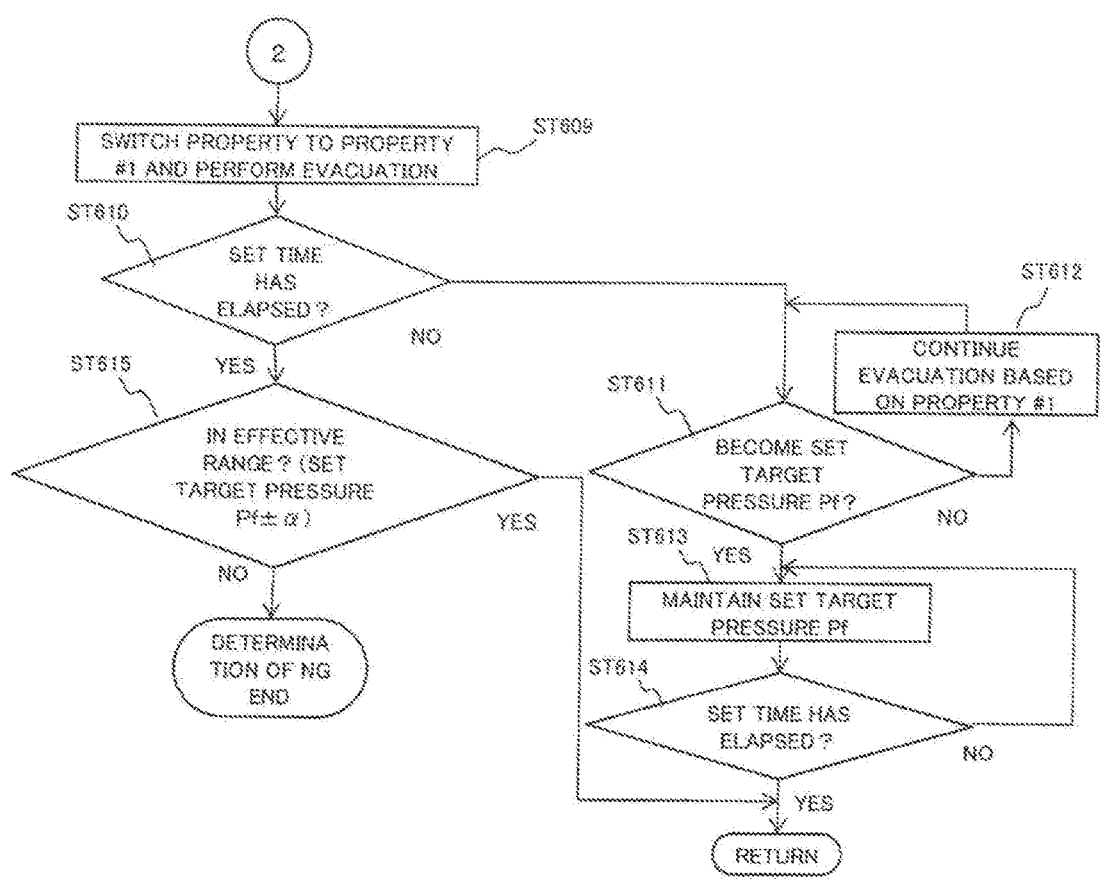
FIG. 13B is a flowchart showing a control example of the vacuum reflow furnace 100.
Figure 14A:
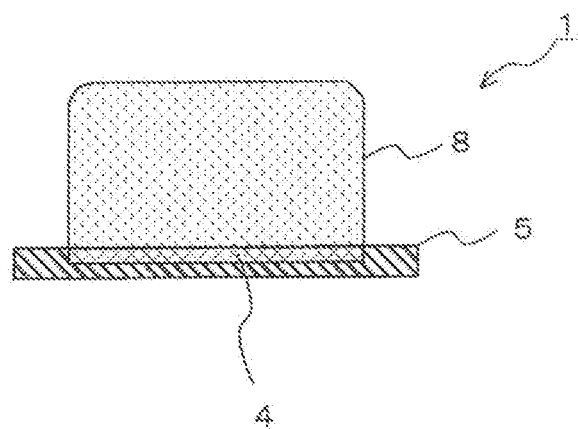
FIG. 14A is a schematic view showing a hot blast reflow example (Part 1) according to a conventional example.
Figure 14B:
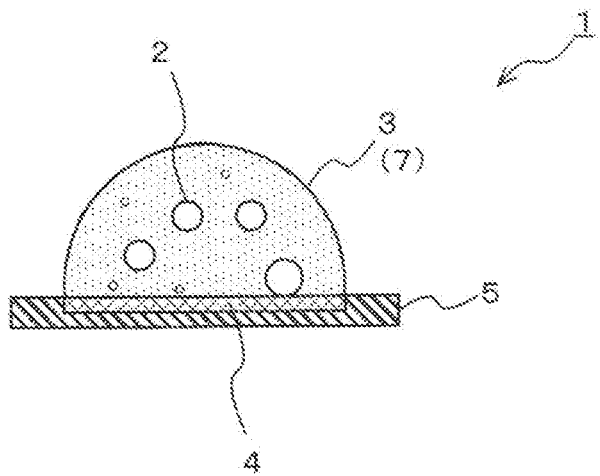
FIG. 14B is a schematic view showing a hot blast reflow example (Part 2) according to a conventional example.
Figure 15:
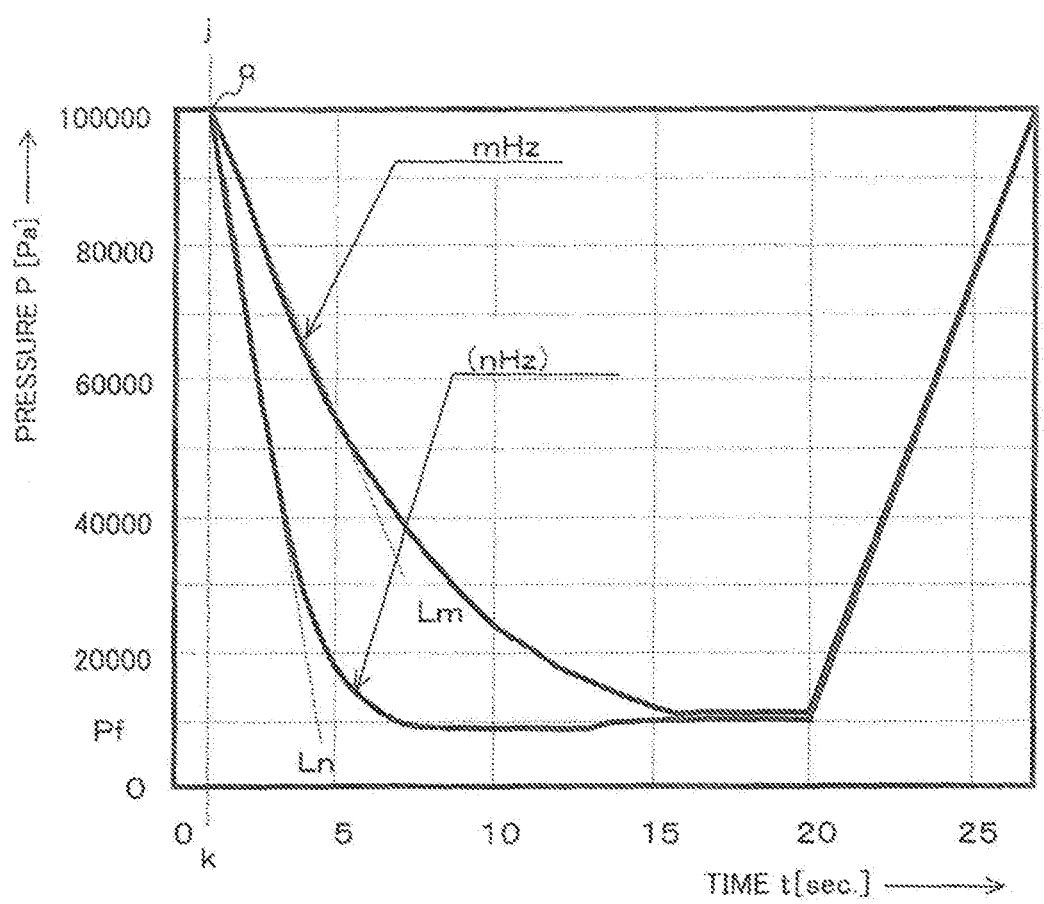
FIG. 15 is a graph showing evacuation properties at the time of evacuation using a fixed pump output.

In this example, the process is shifted to a subroutine, as shown in FIG. 13A and FIG. 13B, in which the control portion 61 controls the pump output based on the evacuation control property #3 at a step ST601 shown in FIG. 8. The pump 23 is driven after the evacuation control property #3 (30 Hz) at the same time as the control starts.

Next, at a step ST602, the control portion 61 calculates, in real time, the amount of decrease in degree of vacuum per unit time at every predetermined interval.

When the elapsed time has not arrived at the predetermined elapsed time yet at a step ST603, the process is shifted to a step ST604 in which the evacuation based on the evacuation control property #3. When the elapsed time has arrived at the predetermined elapsed time at the step ST603, the process is shifted to a step ST605 in which the control portion 61 sets, as a reference value Xrf, the amount of decrease in degree of vacuum per unit time calculated when the elapsed time has arrived at the predetermined elapsed time. At a step ST606, the evacuation control property is switched from #3 to #2. In the evacuation control property #2, the pump 23 is driven after the evacuation control property #2 (40 Hz).

At a step ST607, the control portion 61 compares the amount of decrease X in degree of vacuum per unit time calculated in real time with the reference value Xrf as to whether or not the calculated amount of decrease X is smaller than the reference value Xrf.

When the calculated amount of decrease X is equal to or larger than the reference value Xrf, the process is shifted to a step ST608 in which the evacuation based on the evacuation control property #2 is continued. When the amount of decrease X calculated at the step ST607 is smaller than the reference value Xrf, the process is shifted to a step ST609 in which the control portion 61 switches the evacuation control property from #2 to #1. In the evacuation control property #1, the pump 23 is driven after the evacuation control property #1 (60 Hz).

At a step ST610, the control portion 61 branches the control in response to whether the time set as the evacuation time has elapsed (elapse of the set time). When the set time has not elapsed yet, the control is branched in response to whether the chamber 40 has arrived at the set target pressure Pf (for example, Pf=10000 [Pa]) at a step ST611. When the chamber 40 has not arrived at the set target pressure Pf yet at the step ST611, the evacuation based on the evacuation control property #1 is continued at a step ST612, and the process is returned to the step ST611. When the chamber 40 has arrived at the set target pressure Pf at the step ST611, the set target pressure Pf is maintained (a step ST613). However, at a next step ST614, the control is branched in response to whether the time set as the evacuation time has elapsed (elapse of the set time). When the set time has not elapsed yet, control is performed so that the process is returned to the step ST613. When the time set as the evacuation time has elapsed (elapse of the set time) at the step ST614, vacuum break at the step ST64 shown in FIG. 11 is started.

Also, when the control portion 61 has determined that the time set as the evacuation time has elapsed (elapse of the set time) at the step ST610, the process is shifted to a step ST615. At this step ST615, the pressure within the chamber at the current moment is measured. When the measured current pressure falls within a set effective range (in the case of this example, range of the set target pressure Pf±1000 (Pa)), processing of regarding vacuum-processing as valid is performed, and then vacuum break at the step ST64 shown in FIG. 11 is started. When the control portion 61 has determined that the current pressure falls outside the set effective range at the step ST615, processing of regarding vacuum-processing as invalid (NG) is performed. When the determination of invalidity (NG) has been made, the result of invalidity (NG) may be informed, for example, by means of alert.

By this evacuation control, soldering (void removal) can be performed while the degree of vacuum in the chamber 40 is kept within a specified time and at a fixed atmosphere (vacuum deaeration).

At the step ST64, the control portion 61 starts the vacuum break within the chamber 40. In this vacuum break, for example, the pump 23 is stopped, and the release valve 25 is operated. Then, the $N_2$ gas is supplied into the chamber 40 to increase the degree of vacuum in the container 41 at a fixed rate (like a linear function) (see the linear characteristic shown in FIG. 7).

When the degree of vacuum in the chamber 40 has arrived at the atmospheric pressure, the process is shifted to a step ST66 in which the control portion 61 controls the elevating mechanism 43 to lift up the container 41. The elevating mechanism 43 receives the elevating control signal S43 from the control unit 60 to drive a cylinder, not shown, and the like based on the elevating control signal S43, so that the container 41 is brought into an open state.

At a step ST67, the control portion 61 executes a workpiece export processing. The conveyance mechanism 70 receives the conveyance control signal S70 from the control unit 60 to operate the moving beam 28 based on the conveyance control signal S70, so that the workpiece 1 is intermittently fed (see FIG. 5). The conveyance mechanism 70 is configured to import the next workpiece 1 onto the base 42 when the workpiece 1 has been exported from the base 42.

When the workpiece 1 has been fed and passed to the cooling portion 50, the process is returned to the step ST5 in the main routine, and is shifted to a step ST6. At the step ST6, the control portion 61 executes cooling of the workpiece 1. At this time, the cooling portion 50 receives the cooling control signal S50 from the control unit 60 to drive heat exchangers, fans and the like based on the cooling control signal S50, so that the workpiece 1 is cooled. This enables the workpiece 1 to be cooled at a desired temperature, 60° C. in this example.

At the step ST7, the control portion 61 controls the conveyance mechanism 70 so as to export the workpiece 1 from the cooling portion 50 to outside. Thereafter, at the step ST8, the control portion 61 executes the determination as to whether vacuum soldering of all the workpieces 1 has been completed. When vacuum soldering of all the workpieces 1 has not been completed yet, the process is returned to the step ST2 to continue the import processing, heating, vacuum deaeration and cooling of the workpiece 1. When vacuum soldering of all the workpieces 1 has been completed, the control is terminated.

Thus, according to the vacuum reflow furnace 100 and the control method therefor as the embodiments of the invention, the control portion 61 starts evacuation using a predetermined pump output, then calculates the amount of decrease in degree of vacuum per unit time after a predetermined elapsed time, and sets this value as a reference value Xrf (Pa/sec). The control portion 61 continuously acquires the amount of decrease X in degree of vacuum per unit time, and sequentially switches the pump output to a higher output when the amount of decrease X in degree of vacuum per unit time has become smaller than the reference value Xrf. In this manner, the evacuation control is performed along an initial virtual asymptotic line at the beginning of the evacuation of the chamber 40 from an atmospheric pressure state.

This control can increase selectivity of evacuation conditions and enables quick evacuation of the chamber to the specified set target pressure Pf. Thus, the throughput of the chamber can be adjusted. On the other hand, it is possible to suppress the generation of voids and to prevent scattering of flux, components and the like, thereby ensuring high-quality vacuum soldering with less voids under a set degree of vacuum.

INDUSTRIAL APPLICABILITY

The present invention is quite preferable by being applied to a vacuum reflow furnace having the function of performing defoaming and/or deaerating process to the solder in a vacuum molten state when a surface mounting component or the like is mounted at a predetermined position on a substrate to solder the component and the substrate.

EXPLANATION OF CODES

10: main body
11: inlet
12: outlet
13: conveying portion
16: conveying path
17, 27: fixed beam
18, 28: moving beam
20: preliminary heating portion (heating portion)
21: operating part
23: pump
24: vacuum pressure sensor
25: release valve
26: arrival sensor
29: gas-supplying portion
30: main heating portion (heating portion)
40: chamber
41: container
42: base
43: elevating mechanism
44: panel heater (heating portion)
45, 46: fixed beams (supporting portion)
47: pin
48: seal member
50: cooling portion
100: vacuum reflow furnace (vacuum soldering device)

The invention claimed is:

1. A vacuum-processing device comprising:
a chamber to be evacuated;
an operating part that sets a condition for evacuating the chamber;
a pump that evacuates the chamber based on the evacuation condition, the pump having a plurality of pump outputs; and
a control portion comprising program instructions that, when executed by at least one processor, cause the at least one processor to:
perform an evacuation control of the pump so as to switch a pump output to a higher pump output based on a fact that an amount of decrease in degree of vacuum per unit time, at a time of evacuation of the chamber using a predetermined pump output, has become smaller than a reference value, and
set, as the reference value the amount of decrease in degree of vacuum per unit time when a predetermined time elapses from the evacuation of the chamber using a predetermined pump output.

2. The vacuum-processing device according to claim 1, wherein the program instructions further cause the at least one processor to:
continuously compare the amount of decrease in degree of vacuum per unit time for the selected pump output with the reference value during evacuation, and
switch the pump output to the higher pump output when the amount of decrease in degree of vacuum per unit time has become smaller than the reference value.

3. A vacuum soldering device comprising the vacuum-processing device according to claim 1.

4. A vacuum soldering device comprising the vacuum-processing device according to claim 2.

* * * * *